(12) United States Patent
Li et al.

(10) Patent No.: US 7,462,538 B2
(45) Date of Patent: Dec. 9, 2008

(54) METHODS OF MANUFACTURING MULTIPLE GATE CMOS TRANSISTORS HAVING DIFFERENT GATE DIELECTRIC MATERIALS

(75) Inventors: Hong-Jyh Li, Austin, TX (US); Thomas Schulz, Austin, TX (US)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 11/273,747

(22) Filed: Nov. 15, 2005

(65) Prior Publication Data

US 2007/0111448 A1    May 17, 2007

(51) Int. Cl.
*H01L 21/336* (2006.01)
*H01L 29/80* (2006.01)
(52) U.S. Cl. ...................... 438/264; 257/274
(58) Field of Classification Search ................ 438/264; 257/274, E21.41, E21.411–419
See application file for complete search history.

(56) References Cited

U.S. PATENT DOCUMENTS

| | | | |
|---|---|---|---|
| 4,432,035 A | 2/1984 | Hsieh et al. |
| 4,990,974 A | 2/1991 | Vinal |
| 5,041,885 A | 8/1991 | Gualandris et al. |
| 5,066,995 A | 11/1991 | Young et al. |
| 5,162,263 A | 11/1992 | Kunishima et al. |
| 5,321,287 A | 6/1994 | Uemura et al. |
| 5,763,922 A | 6/1998 | Chau |
| 5,994,747 A | 11/1999 | Wu |
| 6,020,243 A | 2/2000 | Wallace et al. |
| 6,027,961 A | 2/2000 | Maiti et al. |
| 6,048,769 A | 4/2000 | Chau |
| 6,084,280 A | 7/2000 | Gardner et al. |

6,124,171 A    9/2000    Arghavani et al.

(Continued)

FOREIGN PATENT DOCUMENTS

EP    1 388 889 A2    2/2004

(Continued)

OTHER PUBLICATIONS

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

(Continued)

*Primary Examiner*—Matthew S. Smith
*Assistant Examiner*—Walter H Swanson
(74) *Attorney, Agent, or Firm*—Slater & Matsil, L.L.P.

(57) ABSTRACT

Semiconductor devices with transistors having different gate dielectric materials and methods of manufacture thereof are disclosed. One embodiment includes a semiconductor device including a workpiece, the workpiece including a first region and a second region proximate the first region. A first transistor is disposed in the first region of the workpiece, the first transistor having at least two first gate electrodes. A first gate dielectric is disposed proximate each of the at least two first gate electrodes, the first gate dielectric comprising a first material. A second transistor is disposed in the second region of the workpiece, the second transistor having at least two second gate electrodes. A second gate dielectric is disposed proximate each of the at least two second gate electrodes, the second gate dielectric comprising a second material. The second material is different than the first material.

26 Claims, 12 Drawing Sheets

U.S. PATENT DOCUMENTS

| | | | |
|---|---|---|---|
| 6,159,782 | A | 12/2000 | Xiang et al. |
| 6,184,072 | B1 | 2/2001 | Kaushik et al. |
| 6,225,163 | B1 | 5/2001 | Bergemont |
| 6,291,867 | B1 | 9/2001 | Wallace et al. |
| 6,348,390 | B1 | 2/2002 | Wu |
| 6,410,967 | B1 | 6/2002 | Hause et al. |
| 6,444,555 | B2 | 9/2002 | Ibok |
| 6,475,908 | B1 | 11/2002 | Lin et al. |
| 6,492,217 | B1 | 12/2002 | Bai et al. |
| 6,528,858 | B1 | 3/2003 | Yu et al. |
| 6,656,764 | B1 | 12/2003 | Wang et al. |
| 6,716,685 | B2 | 4/2004 | Lahaug |
| 6,720,221 | B1 | 4/2004 | Ahn et al. |
| 6,737,313 | B1 * | 5/2004 | Marsh et al. .............. 438/240 |
| 6,740,944 | B1 | 5/2004 | McElheny et al. |
| 6,852,645 | B2 | 2/2005 | Colombo et al. |
| 6,897,095 | B1 | 5/2005 | Adetutu et al. |
| 6,921,691 | B1 | 7/2005 | Li et al. |
| 7,060,568 | B2 | 6/2006 | Metz et al. |
| 7,091,568 | B2 | 8/2006 | Hegde et al. |
| 2002/0005556 | A1 | 1/2002 | Cartier et al. |
| 2002/0053711 | A1 | 5/2002 | Chau et al. |
| 2002/0135030 | A1 | 9/2002 | Horikawa |
| 2002/0135048 | A1 | 9/2002 | Ahn et al. |
| 2002/0151125 | A1 | 10/2002 | Kim et al. |
| 2002/0153573 | A1 | 10/2002 | Mogami |
| 2003/0057432 | A1 | 3/2003 | Gardner et al. |
| 2003/0104663 | A1 | 6/2003 | Visokay et al. |
| 2003/0116804 | A1 | 6/2003 | Visokay et al. |
| 2003/0137017 | A1 | 7/2003 | Hisamoto et al. |
| 2003/0141560 | A1 | 7/2003 | Sun |
| 2003/0219953 | A1 | 11/2003 | Mayuzumi |
| 2004/0000695 | A1 | 1/2004 | Matsuo |
| 2004/0005749 | A1 | 1/2004 | Choi et al. |
| 2004/0009675 | A1 | 1/2004 | Eissa et al. |
| 2004/0023462 | A1 | 2/2004 | Rotondaro et al. |
| 2004/0132271 | A1 | 7/2004 | Ang et al. |
| 2004/0180487 | A1 | 9/2004 | Eppich et al. |
| 2004/0217429 | A1 | 11/2004 | Lin et al. |
| 2004/0242021 | A1 | 12/2004 | Kraus et al. |
| 2005/0035345 | A1 | 2/2005 | Lin et al. |
| 2005/0045965 | A1 | 3/2005 | Lin et al. |
| 2005/0064663 | A1 | 3/2005 | Saito |
| 2005/0098839 | A1 | 5/2005 | Lee et al. |
| 2005/0101159 | A1 | 5/2005 | Droopad |
| 2005/0139926 | A1 | 6/2005 | Shimizu et al. |
| 2005/0148137 | A1 | 7/2005 | Brask et al. |
| 2005/0167750 | A1 | 8/2005 | Yang et al. |
| 2005/0224897 | A1 | 10/2005 | Chen et al. |
| 2005/0245019 | A1 | 11/2005 | Luo et al. |
| 2005/0280104 | A1 | 12/2005 | Li |
| 2006/0003507 | A1 | 1/2006 | Jung et al. |
| 2006/0017112 | A1 | 1/2006 | Wang et al. |
| 2006/0038236 | A1 | 2/2006 | Yamamoto |
| 2006/0118879 | A1 | 6/2006 | Li |
| 2006/0131652 | A1 | 6/2006 | Li |
| 2006/0141729 | A1 | 6/2006 | Wang et al. |
| 2006/0211195 | A1 | 9/2006 | Luan |
| 2006/0223335 | A1 * | 10/2006 | Mathew et al. .............. 438/766 |
| 2006/0275975 | A1 * | 12/2006 | Yeh et al. .................... 438/216 |
| 2007/0018245 | A1 * | 1/2007 | Jeng ........................... 257/344 |
| 2007/0034945 | A1 | 2/2007 | Bohr et al. |

FOREIGN PATENT DOCUMENTS

| | | |
|---|---|---|
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

Li, H.-J., et al., "Dual High-k Gate Dielectric With Poly Gate Electrode: HfSiON on nMOS and $Al_2O_3$ Capping Layer on pMOS," IEEE Electron Device Letters, Jul. 2005, pp. 441-444, vol. 26, No. 7, IEEE.

Choi, Y.-K., et al., "FinFET Process Refinements for Improved Mobility and Gate Work Function Engineering," IEDM, 2002, pp. 259-262, IEEE, Los Alamitos, CA.

Choi, Y-K, et al., "Sub-20nm CMOS FinFET Technologies," IEDM, 2001, pp. 421-424, IEEE, Los Alamitos, CA.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

"Front End Processes," The International Technology Roadmap for Semiconductors: 2003 Edition, pp. 23-25, http://member.itrs.net/.

Gannavaram, S., et al., "Low Temperature ($\leq$ 800° C) Recessed Junction Selective Silicon-Germanium Source/Drain Technology for sub-70 nm CMOS," 2000, 4 pp., IEEE, Los Alamitos, CA.

Huang, F.-J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Chang, L., et al., "Extremely Scaled Silicon Nano-CMOS Devices," Proceedings of the IEEE, Nov. 2003, vol. 91, No. 11, pp. 1860-1873, IEEE.

"Front End Processes," The International Technology Roadmap for Semiconductors: 2002 Update, pp. 45-62, http://member.itrs.net/.

Guha, S., et al., "Atomic Beam Deposition of Lanthanum- and Yttrium-Based Oxide Thin Films for Gate Dielectrics," Applied Physics Letters, Oct. 23, 2000, vol. 77, No. 17, pp. 2710-2712, American Institute of Physics.

"High $_K$ Dielectric Materials," Tutorial: Materials for Thin Films / Microelectronics, downloaded Jun. 9, 2004, 3 pp., Sigma-Aldrich Co., St. Lois, Missouri, US, http://www.sigmaaldrich.com/Area_of_Interest/Organic_Inorganic_Chemistry/Materials_Science/Thin_Films_Microelectronics/Tutorial/Dielectric_Materials.html.

Hobbs, C., et al., "Fermi Level Pinning at the PolySi/Metal Oxide Interface," 2003 Symposium on VLSI Technology Digest of Technical Papers, Jun. 2003, 2 pp.

Muller, R.S., et al., "Device Electronics for Integrated Circuits," Second Ed., 1986, pp. 380-385, 398-399, John Wiley & Sons, New York, NY.

Nowak, E.J., et al., "Turning Silicon on its Edge: Overcoming Silicon Scaling Barriers with Double-Gate and FinFET Technology," IEEE Circuits & Devices Magazine, Jan./Feb. 2004, pp. 20-31, IEEE.

Samavedam, S.B., et al., "Fermi Level Pinning with Sub-Monolayer MeOx and Metal Gates," IEEE, Mar. 2003, 4 pp.

Wolf, S., "Silicon Processing for the VLSI Era: vol. II—CMOS Process Integration," 1990, pp. 432-441, Lattice Press, Sunset Beach, CA.

Yu, B., et al., "FinFET Scaling to 10nm Gate Length," IEDM, 2002, pp. 251-254, IEEE.

* cited by examiner

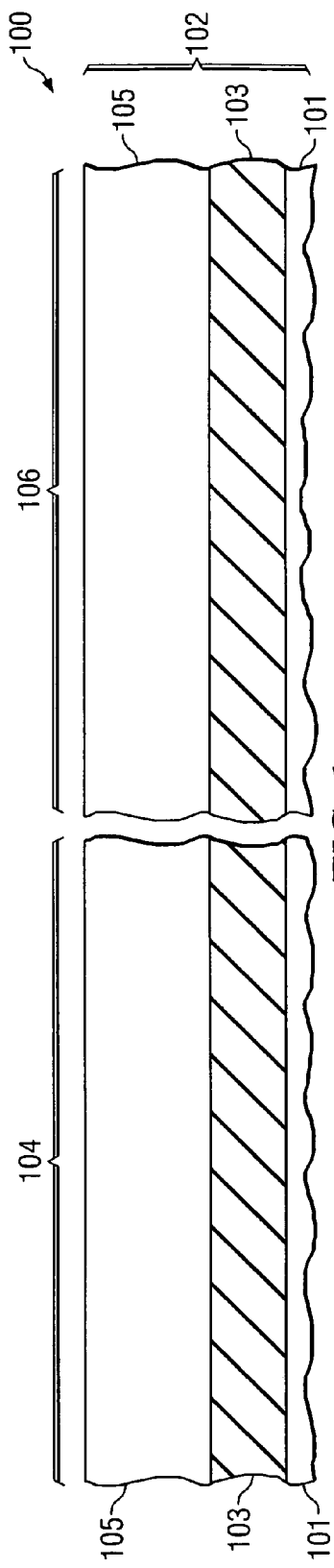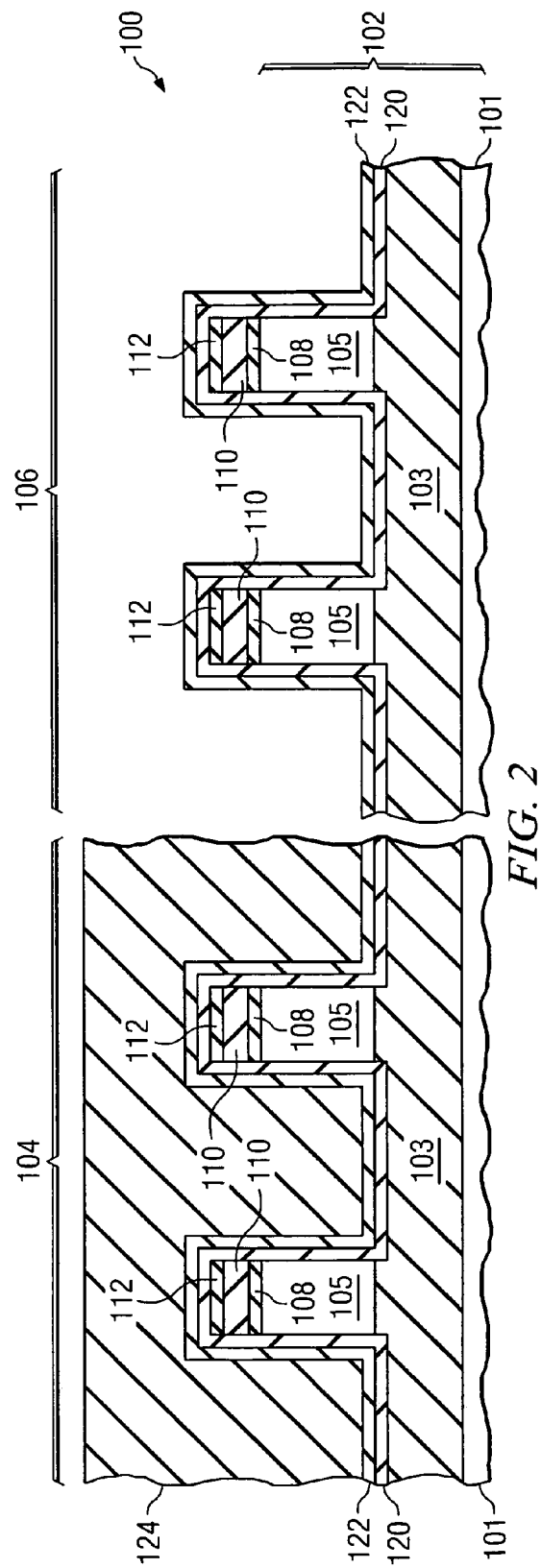

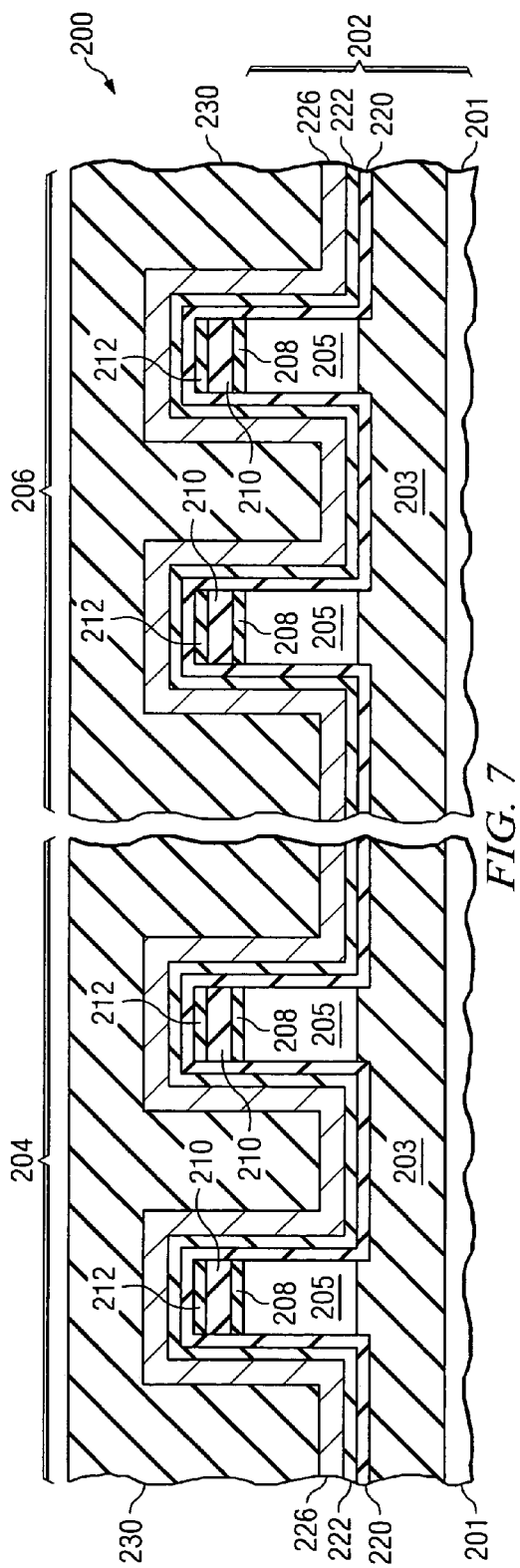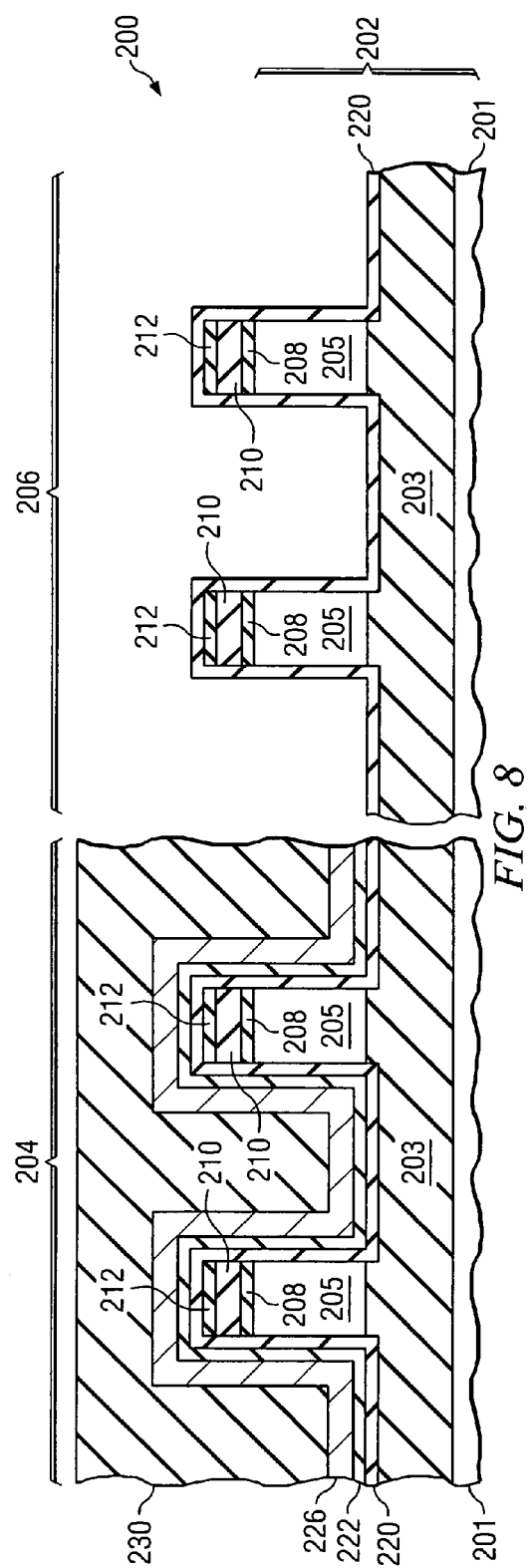

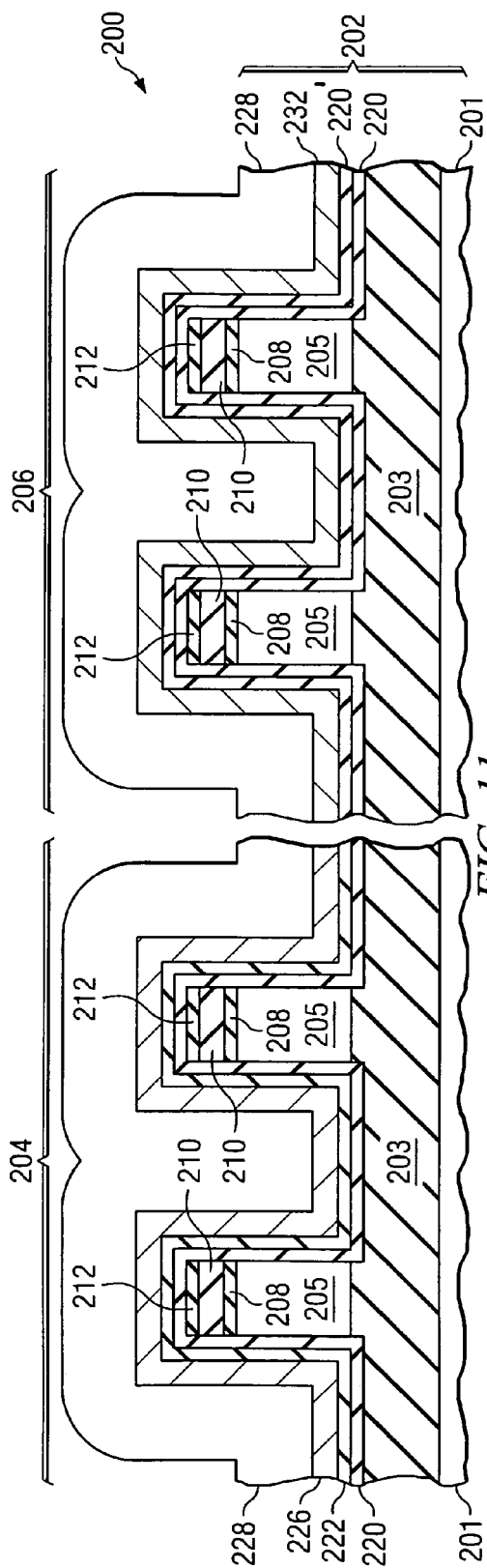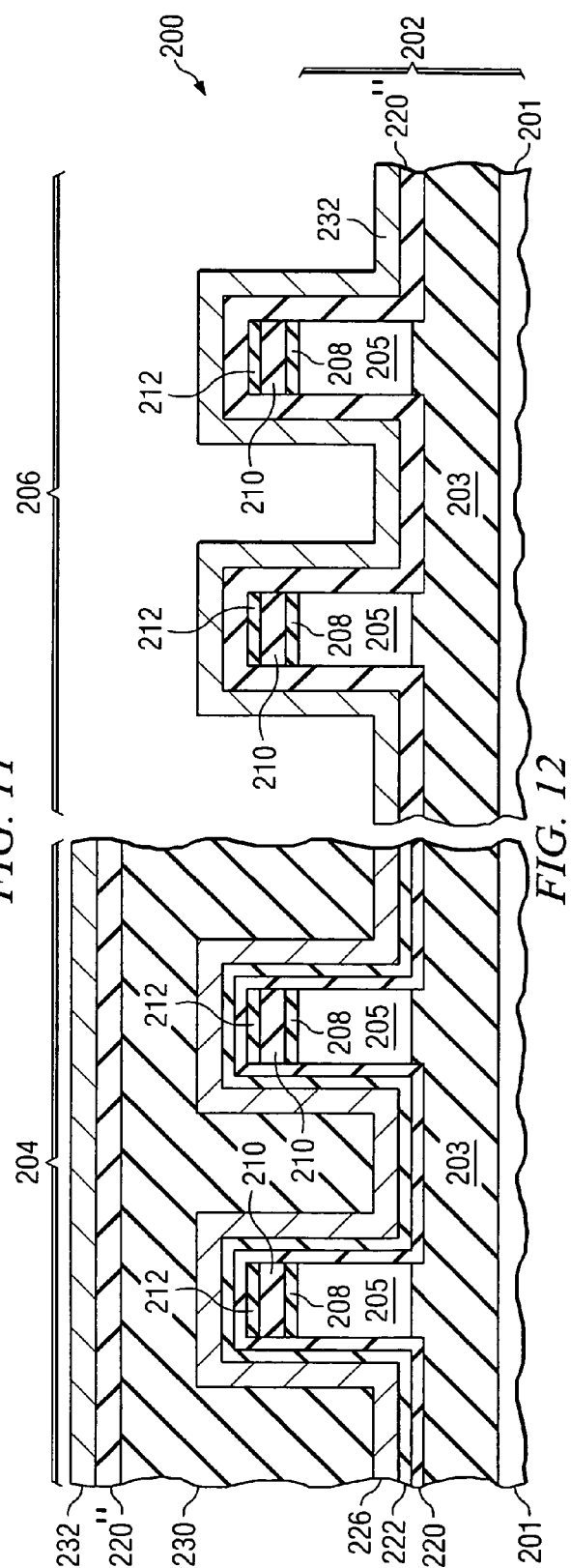

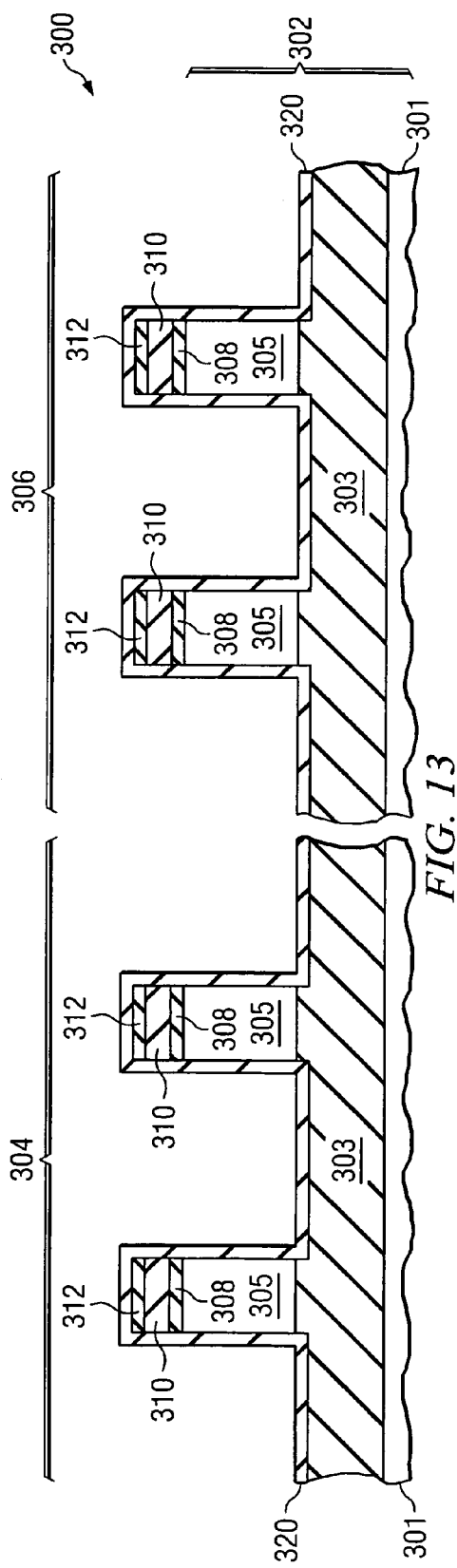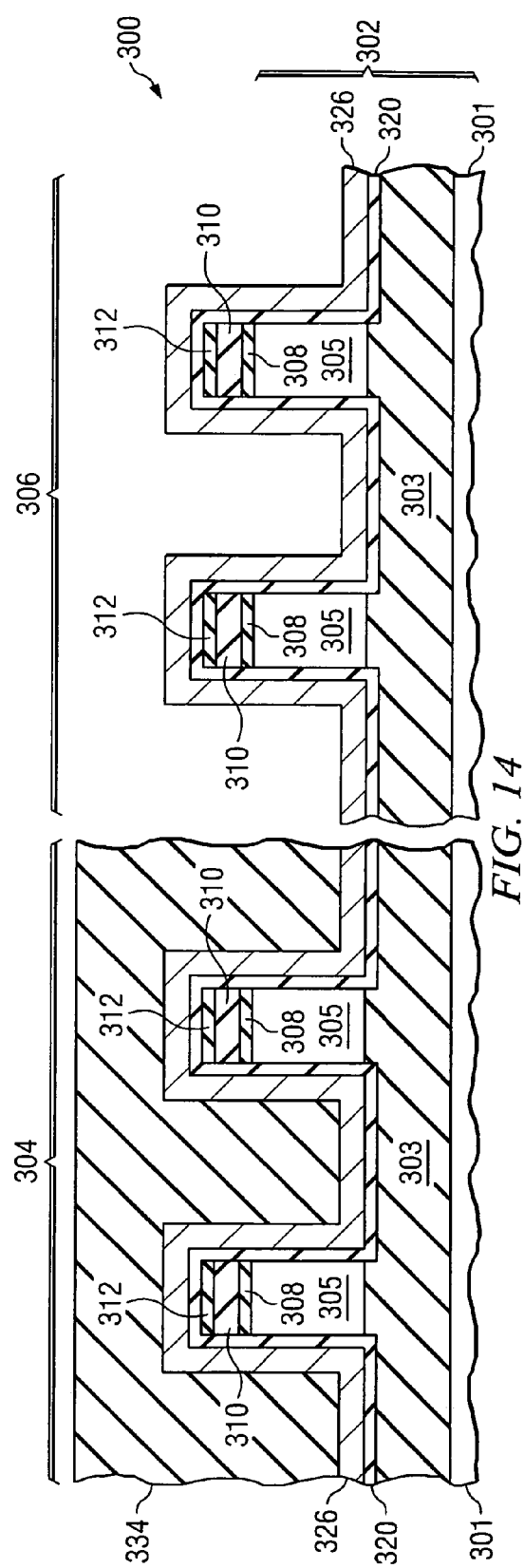

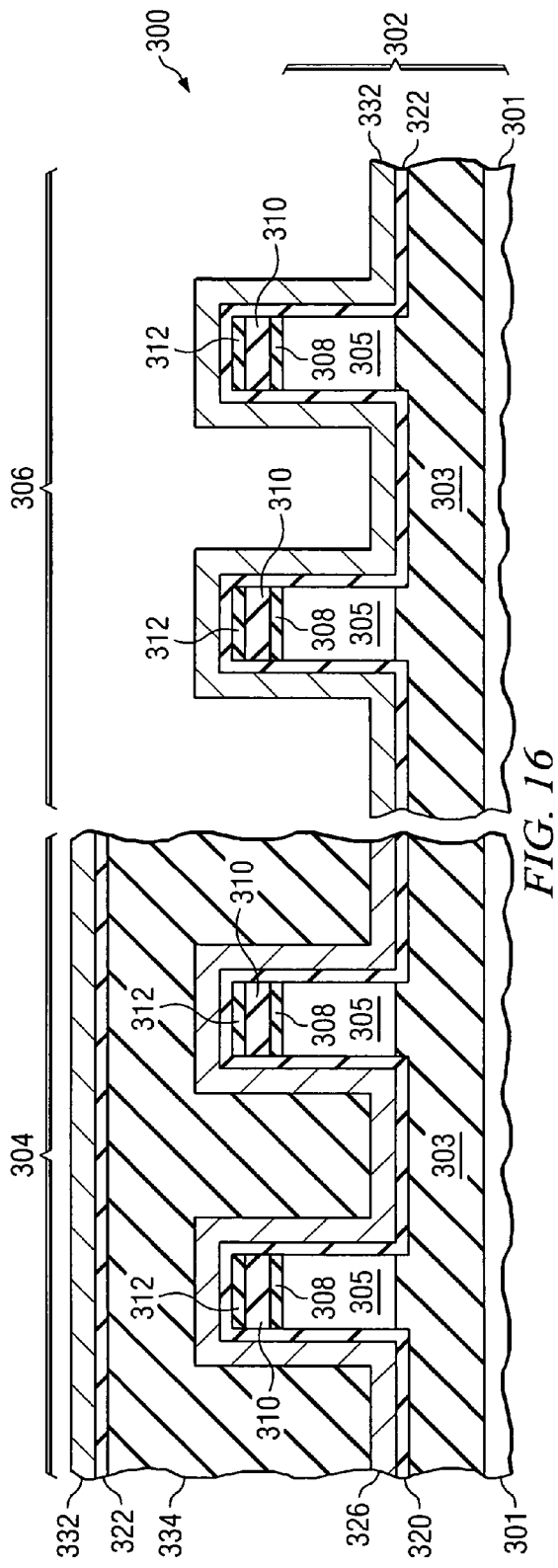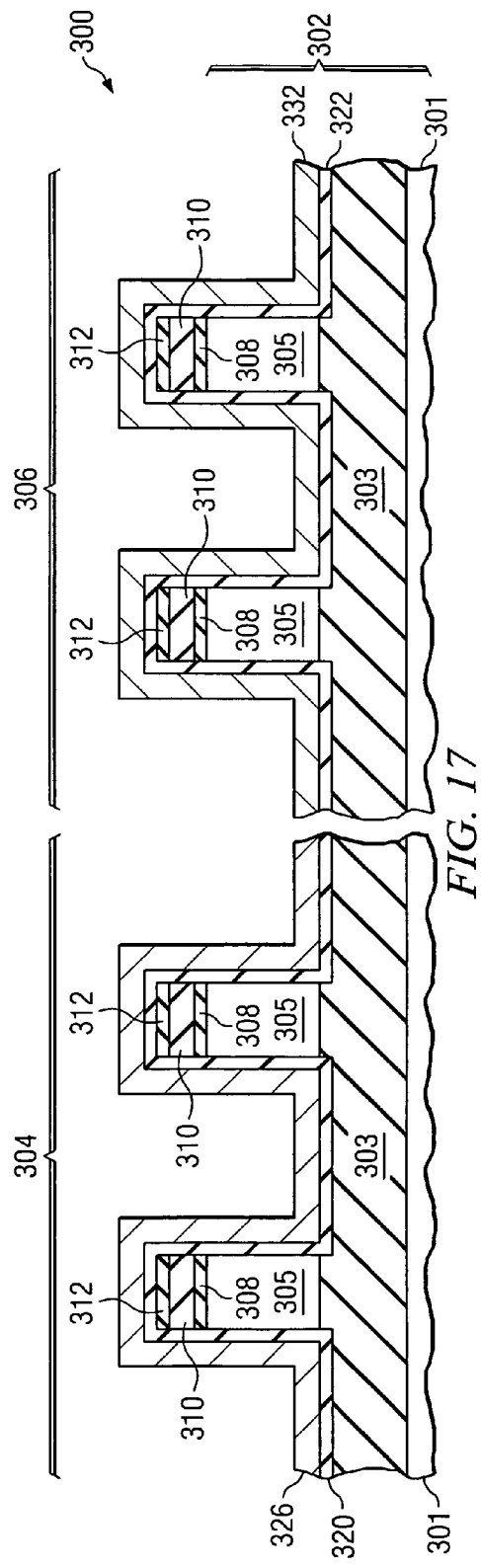
FIG. 16
FIG. 17

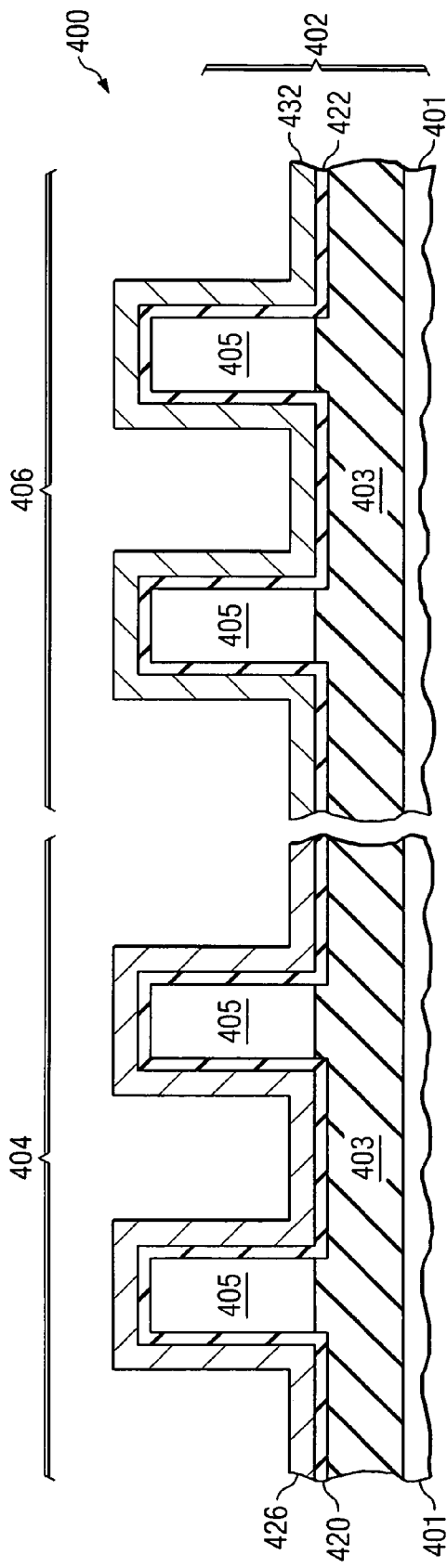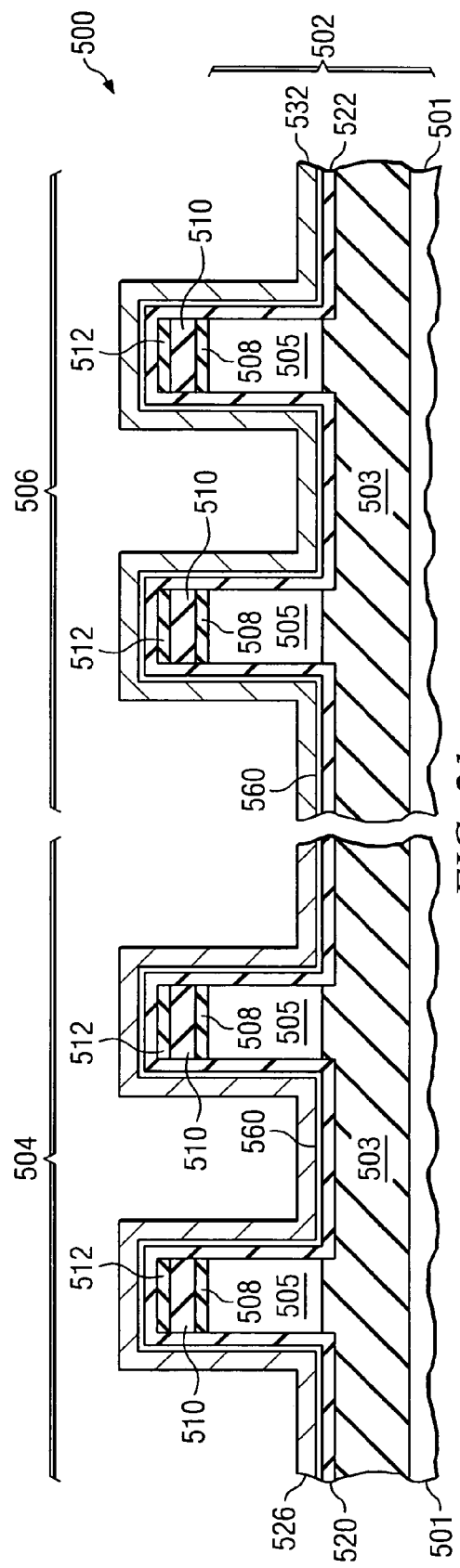

METHODS OF MANUFACTURING MULTIPLE GATE CMOS TRANSISTORS HAVING DIFFERENT GATE DIELECTRIC MATERIALS

CROSS-REFERENCE TO RELATED APPLICATIONS

This application relates to the following co-pending and commonly assigned patent applications: Ser. No. 10/870,616, filed on Jun. 17, 2004, entitled, "CMOS Transistor With Dual High-k Gate Dielectric and Method of Manufacture Thereof"; Ser. No. 11/005,292, filed on Dec. 6, 2004, entitled, "CMOS Transistor and Method of Manufacture Thereof"; Ser. No. 11/017,062, filed on Dec. 20, 2004, entitled, "Transistor Device and Method of Manufacture Thereof"; and Ser. No. 11/187,197, filed on Jul. 21, 2005, entitled, "CMOS Transistors With Dual High-k Gate Dielectric and Methods of Manufacture Thereof," which applications are hereby incorporated herein by reference.

TECHNICAL FIELD

The present invention relates generally to semiconductor devices, and more particularly to transistors having multiple gates and methods of manufacture thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). Conventional MOSFETs have one gate electrode that controls a channel region, and are often referred to as single gate transistors. Early MOSFET processes used one type of doping to create single transistors that comprised either positive or negative channel transistors. Other more recent designs, referred to as complementary MOS (CMOS) devices, use both positive and negative channel devices, e.g., a positive channel metal oxide semiconductor (PMOS) transistor and a negative channel metal oxide semiconductor (NMOS) transistor, in complementary configurations.

Conventional bulk single-gate planar MOSFET devices cannot achieve the requested performance for future technology nodes of 45 nm or beyond. The classic bulk device concept is based on a complex three-dimensional doping profile, which includes channel implantation, source and drain region implantation, lightly doped drain (LDD) extension implantation, and pocket/halo implantation processes, which are not further scalable down in size, because of an increase in dopant fluctuations and stronger parasitic short channel effects, due to lack of potential control in the channel region and the deep substrate. Therefore, the ITRS Roadmap, e.g., disclosed in the 2002 edition of International Technology Roadmap for Semiconductors (ITRS), which is incorporated herein by reference, has proposed two novel design concepts: a fully depleted planar silicon-on-insulator (SOI) MOSFET device, and a vertical multiple-gate finFET (fin field effect transistor) or tri-gate device.

Thus, transistors with multiple gates are an emerging transistor technology. A double gate transistor has two parallel gates that face each other and control the same channel region. A finFET is a vertical double gate device, wherein the channel comprises a vertical fin comprising a semiconductor material, typically formed on a silicon-on-insulator (SOI) substrate. The two gates of a finFET are formed on opposing sidewalls of the vertical fin. A tri-gate transistor has three gates that control the same channel region, e.g., the channel comprises the vertical fin, two of the gates are formed on the sides of the vertical fin, and a third gate is formed on the top of the fin. A finFET structure is similar to a tri-gate transistor, with the third gate being blocked by an insulating material or hard mask disposed on top of the fin. FinFETs and tri-gate transistors, and some of the manufacturing challenges of forming them, are described in a paper entitled, "Turning Silicon on its Edge: Overcoming Silicon Scaling Barriers with Double-Gate and FinFET Technology," by Nowak, E. J., et al., in IEEE Circuits & Devices Magazine, January/February 2004, pp. 20-31, IEEE, which is incorporated herein by reference.

FinFETs and tri-gate transistors may be used to form CMOS devices. One or more finFETs can be used as a PMOS and/or NMOS transistor: often, two or more fins in parallel are used to form a single PMOS or NMOS transistor. FinFETs can be scaled or reduced in size more aggressively than planar transistor structures, and show lower gate-induced drain leakage (GIDL) current, as described in a paper entitled, "Extremely Scaled Silicon Nano-CMOS Devices," by Chang, L., et al., in Proceedings of the IEEE, November 2003, Vol. 91, No. 11, pp. 1860-1873, IEEE, which is incorporated herein by reference. However, multiple gate transistors such as finFETs are more difficult and complicated to manufacture than planar CMOS devices, and they require distinctly different materials and introduce a variety of processing challenges.

Furthermore, it is important to design CMOS devices so that a symmetric threshold voltage $V_t$ for the NMOS and PMOS transistors of the CMOS device is achieved. However, it is difficult to find materials, device structures, and manufacturing processes that will achieve a symmetric threshold voltage $V_t$ as devices are made smaller, and particularly for advanced transistor designs having multiple gates.

Thus, what are needed in the art are improved structures and manufacturing processes for multiple gate transistors.

SUMMARY OF THE INVENTION

These and other problems are generally solved or circumvented, and technical advantages are generally achieved, by preferred embodiments of the present invention, which provide novel designs and methods of manufacture for multiple gate CMOS transistors. A different gate dielectric material is used for a multiple gate PMOS transistor than for a multiple gate NMOS transistor. The multiple gate CMOS device comprises a substantially symmetric threshold voltage $V_t$ for the PMOS and NMOS transistors.

In accordance with a preferred embodiment of the present invention, a semiconductor device includes a workpiece, the workpiece including a first region and a second region proximate the first region. A first transistor is disposed in the first region of the workpiece. The first transistor includes at least two first gate electrodes, and a first gate dielectric is disposed proximate each of the at least two first gate electrodes, the first gate dielectric comprising a first material. A second transistor is disposed in the second region of the workpiece. The second transistor includes at least two second gate electrodes, and a second gate dielectric is disposed proximate each of the at least two second gate electrodes. The second gate dielectric comprises a second material, wherein the second material is different than the first material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIGS. 1 through 6 show cross-sectional views of semiconductor devices at various stages of manufacturing in accordance with preferred embodiments of the present invention, wherein multiple gate CMOS devices comprise a multiple gate PMOS transistor having a first gate dielectric material and a multiple gate NMOS transistor having a second gate dielectric material, wherein the first gate dielectric material and the second gate dielectric material comprise different materials;

FIGS. 7 through 12 show cross-sectional views of semiconductor devices at various stages of manufacturing in accordance with other preferred embodiments of the present invention, wherein multiple gate PMOS transistors have a different gate dielectric material and also may have a different gate material than multiple gate NMOS transistors;

FIGS. 13 through 17 show cross-sectional views of semiconductor devices at various stages of manufacturing in accordance with other preferred embodiments of the present invention, wherein multiple gate PMOS transistors have a different gate dielectric material and also may have a different gate material than multiple gate NMOS transistors;

FIG. 20 shows an embodiment of the present invention implemented in a tri-gate FET; and FIG. 21 shows an embodiment of the present invention, wherein a thin layer of silicon is formed over the gate dielectric material of a finFET device in accordance with an embodiment of the present invention, after forming different gate dielectric materials over the NMOS and PMOS devices.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 3:
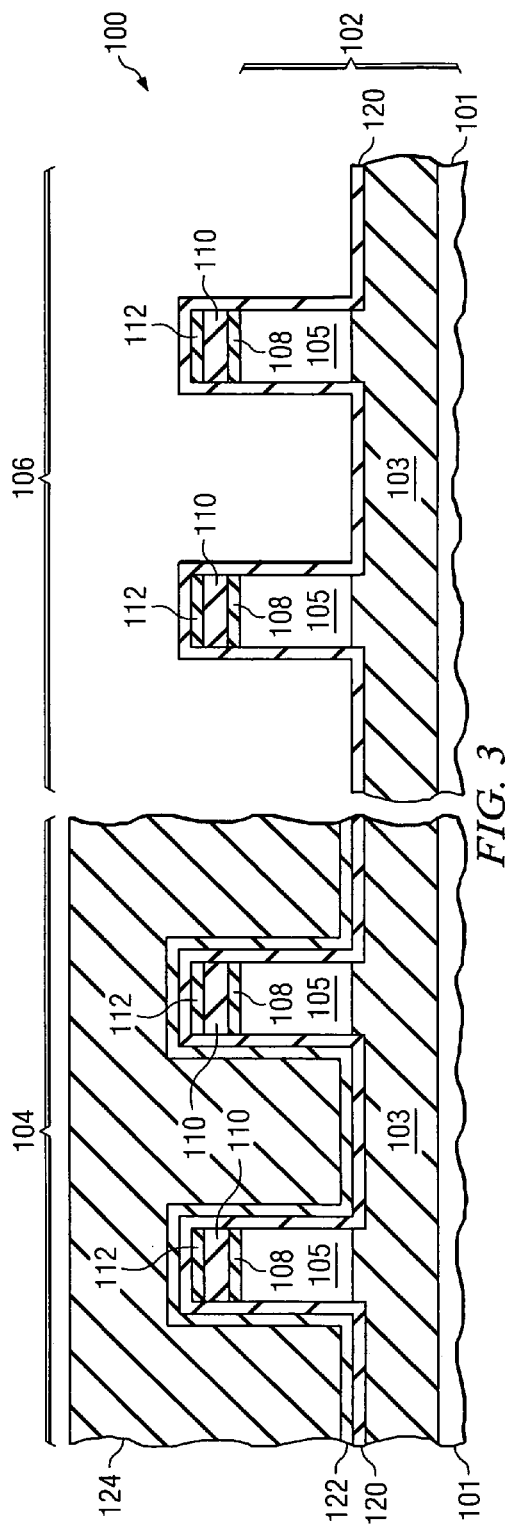

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a semiconductor material can be changed by doping the semiconductor material; for example, undoped polysilicon has a work function of about 4.65 eV, whereas polysilicon doped with boron has a work function of about 5.15 eV.

In general, when used as a gate dielectric of a transistor, high-k gate dielectric materials yield a lower gate leakage current than the $SiO_2$ gate dielectric materials with the same effective oxide thickness (EOT). However, in order to make high-k gate dielectric materials useful in CMOS applications, the threshold voltage $V_t$ should be symmetrical (e.g., $V_{tn}$=0.3V and $V_{tp}$=−0.3V), which cannot be achieved by the use of a single type of high k material for a gate dielectric material of a PMOS and NMOS device, because of the Fermi-pinning effect of the high k material. The high k materials have been found to pin the work function of the PMOS and NMOS transistors at undesirable values, regardless of whether a metal and/or semiconductive material is used as a gate electrode material.

The work function of a polysilicon gate using $HfO_2$, which is one example of a high k dielectric material, as a gate dielectric material has been found to be pinned at a point close to the conduction band of polysilicon, which makes the polysilicon function as n-type polysilicon, even for polysilicon doped with a p-type dopant. See Hobbs, C., et al., in a paper entitled "Fermi Level Pinning at the PolySi/Metal Oxide Interface," published in the 2003 Symposium on VLSI Technology Digest of Technical Papers, June 2003, which is incorporated herein by reference.

For non-classical CMOS structures, such as a finFET or multiple gate MOSFET, the channel is normally lightly doped to gain a mobility benefit. Therefore, the work function requirement for the gate electrode is different for a multiple gate device than for a planar CMOS structure. For the traditional planar structure, the use of high k dielectric materials as a gate dielectric material will require near band-edge work functions for the NMOS and PMOS device, for example.

What are needed in the art are methods of using high k dielectric materials in multiple gate transistors, wherein the work functions are adjustable to achieve a symmetric $V_t$ for a multiple gate CMOS device.

For multiple gate CMOS devices such as finFETs and tri-gate devices, it is recognized herein that an NMOS multiple gate FET and a PMOS multiple gate FET need to have a work function that is about 0.1 eV to 1 eV apart from a mid-gap work function of about 4.6 eV. For example, a multiple gate nFET may require a work function of about 4.4 eV, and a multiple gate pFET device may require a work function of about 4.8 eV, (+/−0.2 of 4.6 eV) in order to achieve a symmetric $V_t$ for the multiple gate NMOS and PMOS devices.

The present invention will be described with respect to preferred embodiments in a specific context, namely finFET CMOS transistors. Embodiments of the present invention may also be applied, however, to other semiconductor device applications where two or more multiple gate transistors are used, such as a tri-gate device. Note that in the drawings shown, only one PMOS device and one NMOS device are shown; however, there may be many multiple gate PMOS and NMOS devices formed during each of the manufacturing processes described herein.

Embodiments of the invention comprise forming a semiconductor device having two multiple gate transistors, wherein a first multiple gate transistor comprises a first gate dielectric, and wherein a second multiple gate transistor comprises a second gate dielectric. The second gate dielectric comprises a different material than the first gate dielectric. The material of the first gate dielectric and second gate dielectric is chosen based on the desired work function and $V_t$ of the first and second multiple gate transistors.

Several preferred embodiments of methods of manufacturing semiconductor devices will be described herein. FIGS. 1 through 6 show cross-sectional views of a semiconductor device 100 at various stages of manufacturing in accordance with a preferred embodiment of the present invention, wherein a CMOS device comprises a multiple gate PMOS transistor and NMOS transistor having different gate dielectric materials. With reference now to FIG. 1, there is shown a semiconductor device 100 in a cross-sectional view including a workpiece 102. The workpiece 102 preferably comprises a silicon-on-insulator (SOI) substrate. The SOI substrate includes a first layer of semiconductive material 101 that comprises a substrate, a buried insulating layer 103 or buried oxide layer disposed over the first layer of semiconductive material 101, and a second layer of semiconductive material 105 disposed over the buried insulating layer 103, for example. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may be doped with P type dopants and N type dopants, e.g., to form P wells and N wells, respectively (not shown). The second layer of semiconductor material 105 may comprise silicon (Si) having a thickness of about 100 nm, for example, although alternatively, the second layer of semiconductor material 105 may comprise other materials and dimensions.

The workpiece 102 includes a first region 104 and a second region 106. The first region 104 comprises a region where a first transistor comprising a multiple gate PMOS device or PMOSFET, as examples, will be formed. The second region 106 comprises a region where a second transistor comprising a multiple gate NMOS device or NMOSFET will be formed, as examples. The PMOS device and NMOS device are not shown in FIG. 1: see FIG. 6. The first region 104 and the second region 106 may be separated by an optional shallow trench isolation (STI) region (not shown in FIG. 1; see FIG. 19 at 350, for example). The first region 104 may be lightly doped with n type dopants, and the second region 106 may be lightly doped with p type dopants. In general, the workpiece 102 is doped with n or p type dopants depending on whether the junctions of the transistor to be formed will be p or n type, respectively.

A hard mask 108/110/112 is formed over the workpiece 102 (not shown in FIG. 1; see FIG. 2 where the hard mask 108/110/112 has already been patterned). The hard mask 108/110/112 comprises a first oxide layer 108 comprising about 5 nm or less of $SiO_2$ formed over the workpiece 102. A nitride layer 110 comprising about 20 nm of $Si_xN_y$ is formed over the first oxide layer 108. A second oxide layer 112 comprising about 20 nm or less of $SiO_2$ is formed over the nitride layer 110. Alternatively, the hard mask 108/110/112 may comprise other materials and dimensions, for example.

The hard mask 108/110/112 is patterned using lithography, e.g., by depositing a layer of photoresist (not shown) over the hard mask 108/110/112, exposing the layer of photoresist to energy using a lithography mask, developing the layer of photoresist, and using the layer of photoresist as a mask to pattern the hard mask 108/110/112, for example. The hard mask 108/110/112, and optionally, also the layer of photoresist are used as a mask to pattern the second layer of semiconductive material 105 of the workpiece 102, as shown in FIG. 2. The buried insulating layer 103 may comprise an etch stop layer for the etch process of the second layer of semiconductive material 105, for example. A top portion of the buried insulating layer 103 may be removed during the etch process of the second layer of semiconductive material 105, as shown. For example, the buried insulating layer 103 may have a thickness of about 150 nm, and may be etched by about 15 nm or less.

The second layer of semiconductor material 105 of the SOI substrate or workpiece 102 forms vertical fins of semiconductor material 105 extending in a vertical direction away from a horizontal direction of the workpiece 102. The fin structures 105 will function as the channels of PMOS and NMOS devices, to be described further herein. The fin structures 105 have a thickness that may comprise about 50 nm or less, as an example, although alternatively, the fins may comprise other dimensions. For example, the thickness of the fin structures 105 may comprise about 5 to 60 nm, or less, in some applications. As another example, the thickness of the fin structures 105 may be larger, having a thickness of about 100 to 1,000 nm, as another example. The thickness of the fin structures 105 may vary as a function of the channel doping and other dimensions of the fin structures 105, as examples, although other parameters may also have an effect on the determination of the dimension of the fin structure 105 thickness.

The fin structures 105 have a height that is substantially equivalent to the thickness of the second layer of semiconductor material 105, for example. Only two fin structures 105 are shown in the first region 104 and the second region 106 of the semiconductor device 100; however, there may be many fin structures 105, e.g., about 1 to 200 fin structures in each first region 104 and second region 106, e.g., for each PMOS and NMOS device, although alternatively, other numbers of fin structures 105 may be used.

The workpiece 102 is preferably cleaned using a pre-gate clean process to remove any contaminants or native oxide from the top surface of the workpiece 102, e.g., the fin structures 105 and buried oxide 103, and also the hard mask 108/110/112. The pre-gate treatment may comprise an HF, HCl, or ozone based cleaning treatment, as examples, although the pre-gate treatment may alternatively comprise other chemistries.

A first material 120 is deposited over the fin structures 105 and the patterned hard mask 108/110/112 disposed over the fin structures 105, as shown in FIG. 2. The first material 120 preferably comprises a high-k dielectric material having a dielectric constant of about 4.0 or greater, in one embodiment.

The first material 120 preferably comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$) combinations thereof, or multiple layers thereof, as examples, although alternatively, the first material 120 may comprise other high k insulating materials or other dielectric materials. The first material 120 preferably comprises a hafnium-based dielectric in some embodiments. The first material 120 may comprise a single layer of material, or alternatively, the first material 120 may comprise two or more layers. In one embodiment, one or more of these materials can be included in the first material 120 in different combinations or in stacked layers.

The first material 120 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first material 120 may be deposited using other suitable deposition techniques. The first material 120 preferably comprises a thickness of about 10 Å to about 70 Å in one embodiment, although alternatively, the first material 120 may comprise other dimensions, such as about 80 Å or less, as an example. In one embodiment, the first material 120 preferably comprises a hafnium-based material, for example. In another embodiment, the first material 120 preferably comprises La, for example.

A second material 122 is deposited over the first material 120, as shown in FIG. 2. The second material 122 preferably comprises a high-k dielectric material having a dielectric constant of about 4.0 or greater, in one embodiment. The second material 122 preferably comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof, as examples, although alternatively, the second material 122 may comprise other high k insulating materials or other dielectric materials. The second material 122 preferably comprises a hafnium-based dielectric in some embodiments. The second material 122 may comprise a single layer of material, or alternatively, the second material 122 may comprise two or more layers.

The second material 122 may be formed using the deposition techniques described for the first material 120, for example. The second material 122 preferably comprises a thickness of about 1 Å to about 50 Å in one embodiment, although alternatively, the second material 122 may comprise other dimensions, such as about 80 Å or less, as an example. In one embodiment, the second material 122 preferably comprises an aluminum-based material, for example. In another embodiment, the second material 122 preferably comprises a Fermi-pinning material such as an aluminum-containing material disposed at the top surface thereof, for example. In some embodiments, e.g., in FIGS. 13-17, the second material 322 preferably comprises Y, for example.

Referring again to FIG. 2, the second material 122 is removed from over the second region 106 of the workpiece 102. This may be accomplished by depositing a hard mask 124 over the entire surface of the workpiece 102, over the second material 122. The hard mask 124 preferably comprises a layer of polysilicon, silicon dioxide, tetraethoxysilate (TEOS), silicon nitride, or combinations or multiple layers thereof, as examples, although alternatively, the hard mask 124 may comprise other materials. The hard mask 124 preferably comprises a thickness of about 200 to 1,000 Å, for example, although alternatively, the hard mask 124 may comprise other dimensions. The hard mask 124 may be deposited by plasma-enhanced chemical vapor deposition (PECVD) or by other suitable deposition techniques, as examples.

The hard mask 124 is removed from over the second region 106 of the workpiece 102, e.g., using lithography. For example, a layer of photoresist (not shown) may be deposited over the hard mask 124, the layer of photoresist is patterned and developed, and then the layer of photoresist is used as a mask while portions of the hard mask 124 in the second region 106 are etched away. The hard mask 124 may be removed using a wet and/or dry etch process, for example. The layer of photoresist is then stripped away or removed.

Next, the hard mask 124 is then used as a mask while the second material 122 is removed or etched away from the second region 106 of the workpiece, as shown in FIG. 3.

Figure 4:
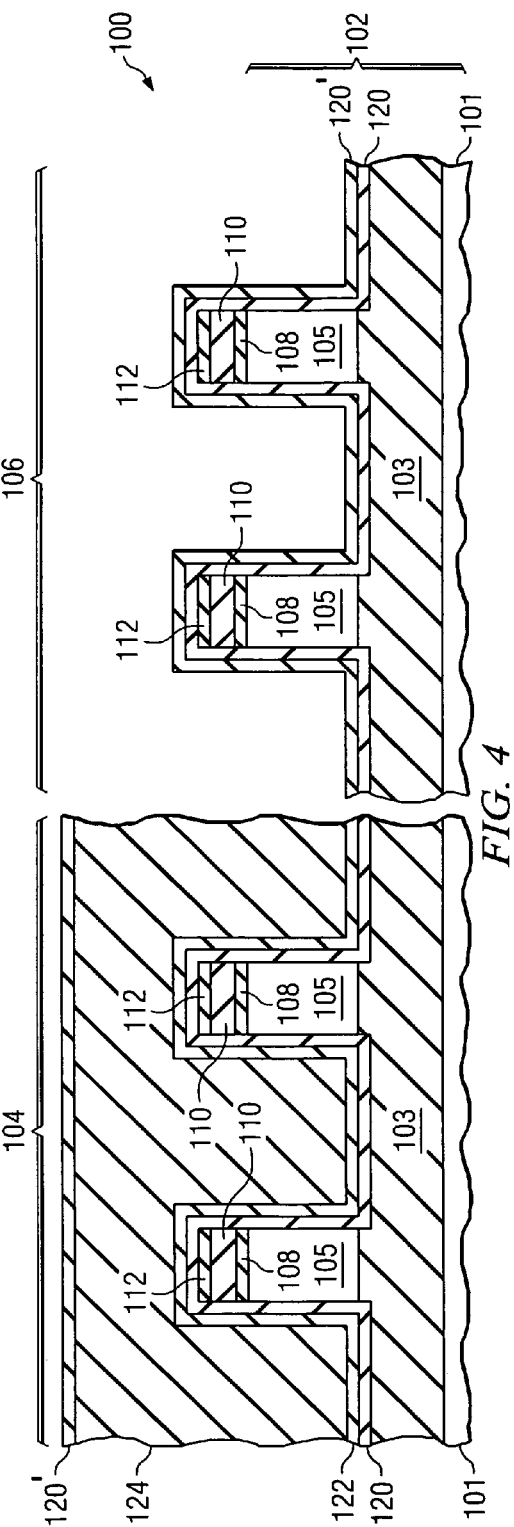

In some embodiments, a third material 120' is then deposited over the hard mask 124 in the first region 104 of the workpiece 102 and over the first material 120 in the second region 106 of the workpiece 102, as shown in FIG. 4. The third material 120' preferably comprises a high-k dielectric material having a dielectric constant of about 4.0 or greater, in one embodiment. The third material 120' preferably comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof, as examples, although alternatively, the third material 120' may comprise other high k insulating materials or other dielectric materials. The third material 120' may comprise a single layer of material, or alternatively, the third material 120' may comprise two or more layers. The third material 120' may be formed using the deposition techniques described for the first material 120, for example. The third material 120' preferably comprises a thickness of about 1 Å to about 50 Å in one embodiment, although alternatively, the third material 120' may comprise other dimensions, such as about 80 Å or less, as an example.

In one embodiment, the third material 120' preferably comprises a hafnium-based material, for example. In another embodiment, the third material 120' preferably comprises the same material as the first material 120, for example. The third material 120' may comprise a re-fill of the first material 120, as another example. In another embodiment, the third material 120' preferably comprises Y, for example.

The hard mask 124 is then removed from over the workpiece 102 in the first region 104. The third material 120' is removed from over the hard mask 124 during the removal of the hard mask 124, e.g., in a lift-off technique.

Figure 5:
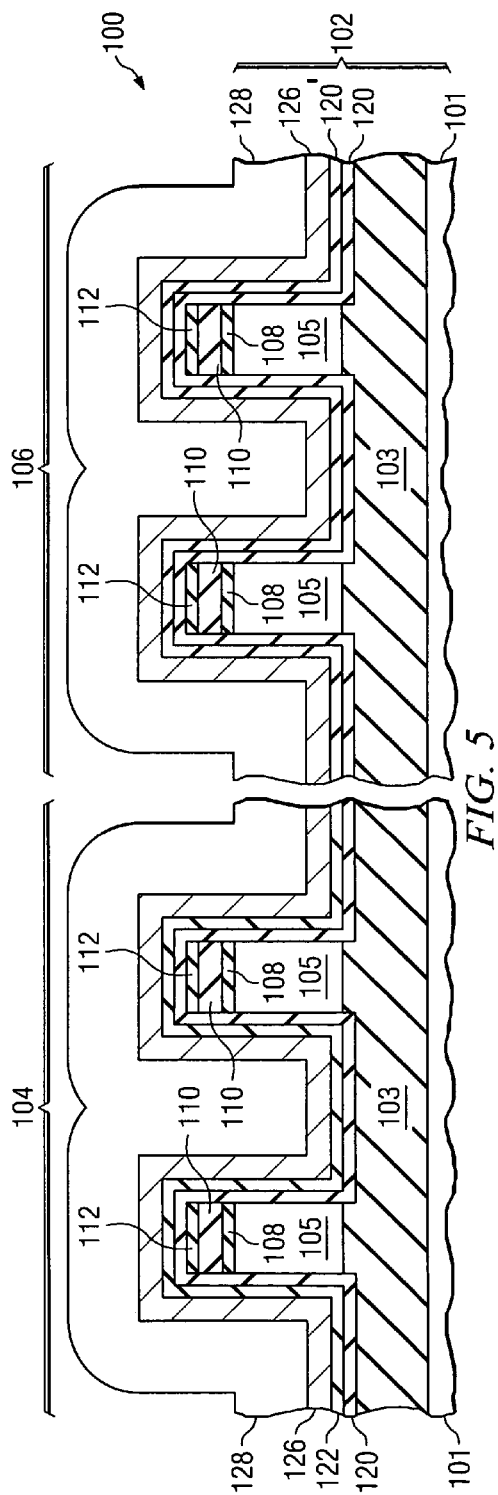

A first gate material 126 is deposited over the second material 122 in the first region 104 of the workpiece 102 and over the third material 120' in the second region 106 of the workpiece 102, as shown in FIG. 5. The first gate material 126 preferably comprises a metal, although alternatively, semiconductive materials may be used for the first gate material 126. The first gate material 126 may comprise TiN, TiCN, HfN, TaN, W, Al, Ru, RuN, RuSiN, RuTa, TaSiN, TiSiN, TaCN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, LaN, LaSiN, WSiN, WSi, polysilicon, a partially silicided material, a fully silicided material (FUSI), other metals, and/or combinations and multiple layers thereof, as examples. The first gate material 126 may be deposited using CVD, PVD, ALD, or other deposition techniques, as examples. The first gate material 126 preferably comprises a thickness of about 10 to 1,000 Å, although alternatively, the first gate material 122 may comprise other dimensions, for example.

If the first gate material 126 comprises FUSI, for example, polysilicon may be deposited over the second material 122 and third material 120', and a metal such as nickel may be deposited over the polysilicon, although other metals may be used. The workpiece 102 may then be heated to about 600 or 700 degrees C. to form a single layer of nickel silicide 126 as a gate material. Alternatively, different process conditions may be used to form other phases of nickel silicide, for example. Due to the Fermi pinning effect, the work function is stable even if different phases of nickel silicide with different work functions are present at the same time, for example.

In the embodiment shown in FIGS. 1 through 5, the first gate material 126 preferably comprises a metal, and an optional second gate material 128 is deposited over the first gate material 126, as shown in FIG. 5. The second gate material 128 preferably comprises a semiconductive material such as polysilicon. Thus, the gates of the multiple gate transistors formed comprise a stack of a metal underlayer in this embodiment, e.g., first gate material 126, with a polysilicon cap layer, e.g., the second gate material 128 disposed over the metal underlayer 126, forming a gate electrode stack 126/128. Alternatively, the gates of the transistors may comprise a combination of a plurality of metal layers that form a gate electrode stack, for example, not shown.

Figure 18:
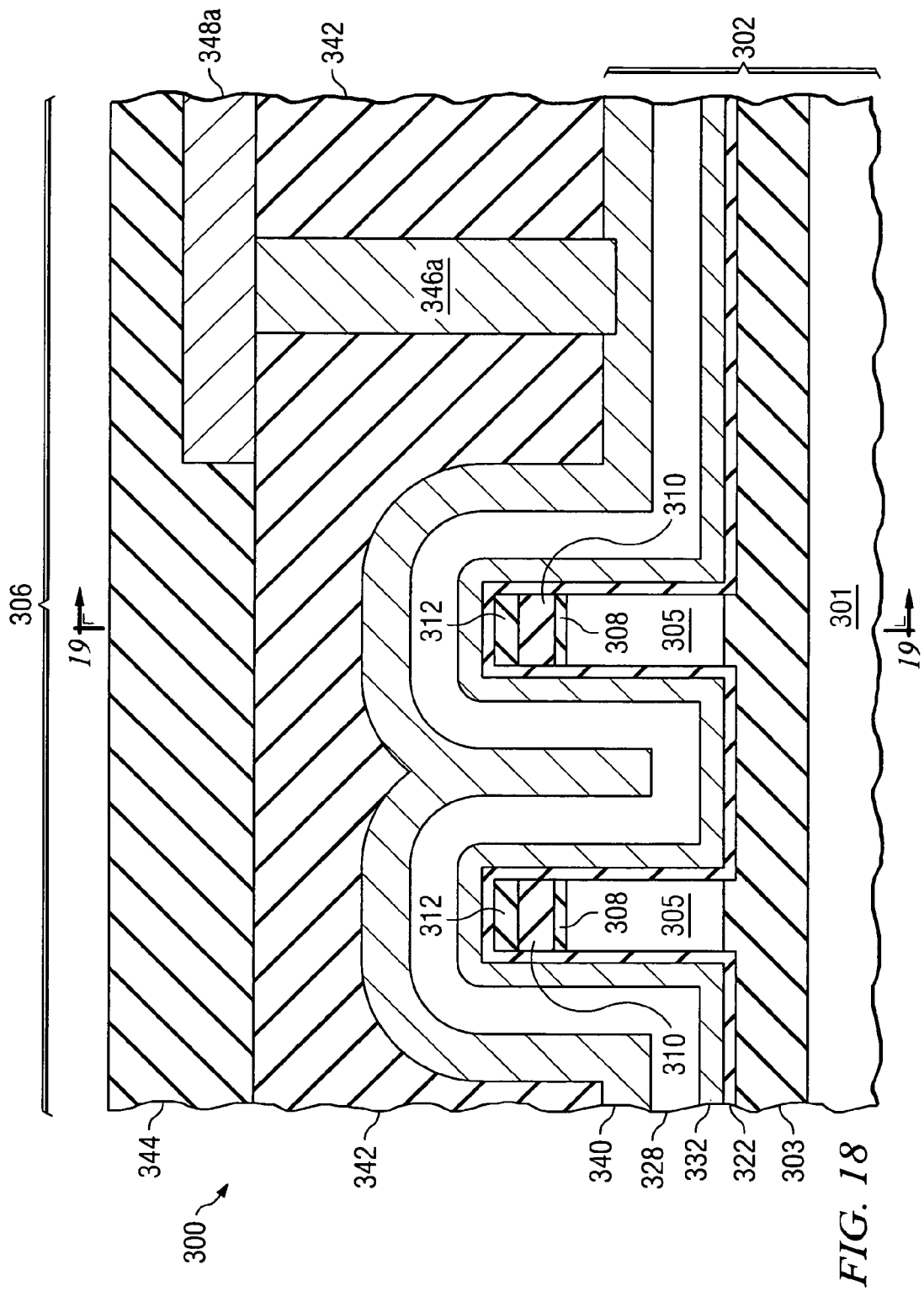
FIG. 18 shows a finFET device in accordance with embodiments of the present invention, after the formation of upper metallization and insulating layers over the finFET device.
Figure 19:
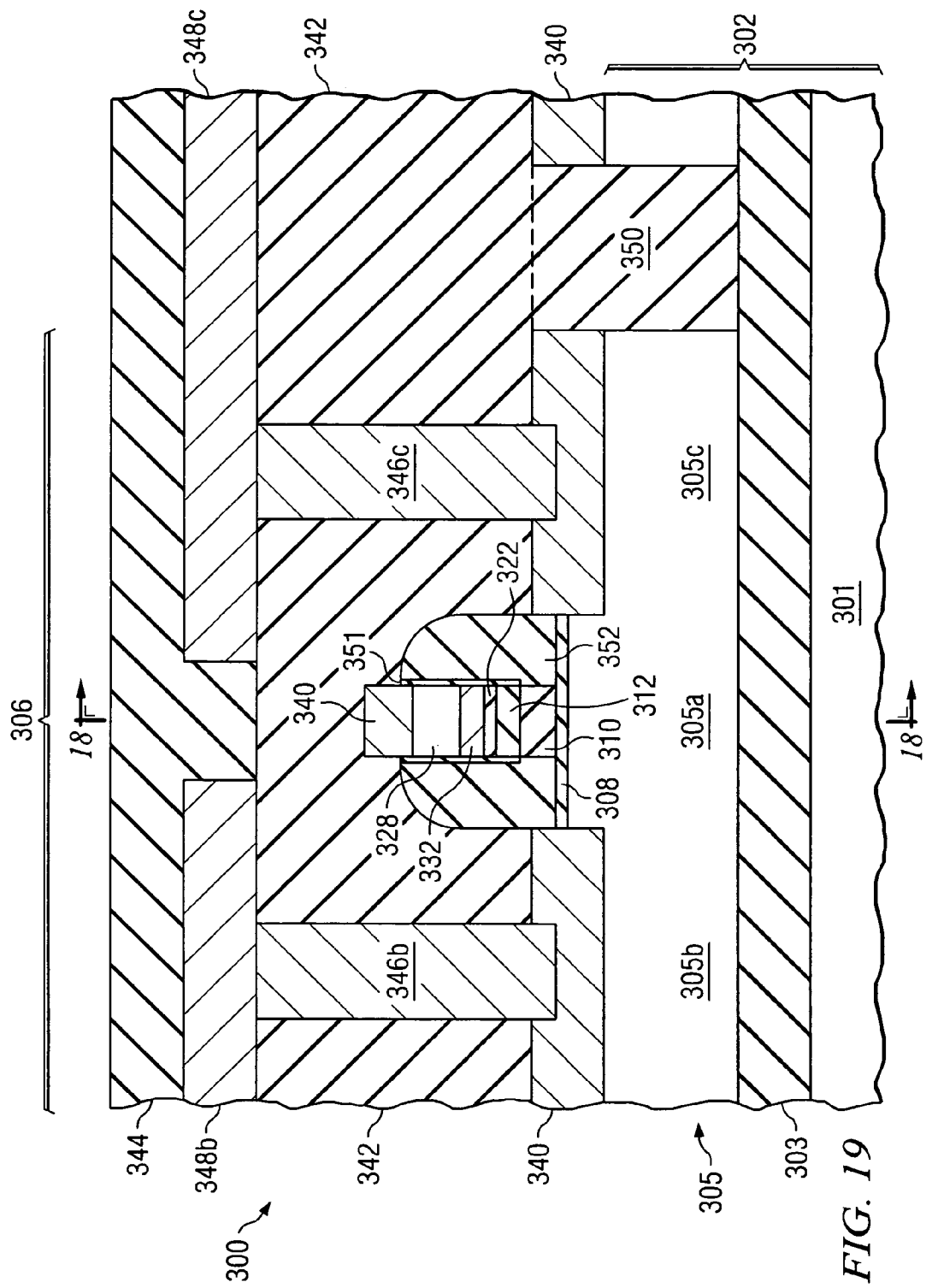
FIG. 19 shows a fin structure of the finFET device shown in FIG. 18 in a view perpendicular to the view shown in FIG. 18.

Next, the manufacturing process for the multiple gate transistor device is continued. For example, the second gate material 128, the first gate material 126, the third material 120', the second material 122, and the first material 120 are patterned to form a multiple gate transistor device. For example, portions of the second gate material 128, the first gate material 126, the second material 122, and the first material 120 may be left residing in the first region 104 after the patterning process to form a multiple gate PMOS device comprising one or more of the fin structures 105. A single PMOS device in the first region 104 may comprise a plurality of fin structures 105 covered by the first material 120, second material 122, first gate material 126, and the second gate material 128. The first material 120 and the second material 122 comprise a first gate dielectric of the PMOS device in the first region 104, and the first gate material 126 and the second gate material 128 comprise two first gate electrodes, e.g., on the sidewalls of the fin structures 105 of the PMOS device. Likewise, portions of the second gate material 128, the first gate material 126, the third material 120', and the first material 120 may be left residing in the second region 106 after the patterning process to form a multiple gate NMOS device comprising one or more of the fin structures 105. A single NMOS device may comprise a plurality of fin structures 105 covered by the first material 120, third material 120', first gate material 126, and the second gate material 128. The first material 120 and the third material 120' comprise a second gate dielectric of the NMOS device in the second region 106, and the first gate material 126 and the second gate material 128 comprise two second gate electrodes, e.g., on the sidewalls of the fin structures 105 of the NMOS device. The PMOS device in the first region 104 and the NMOS device in the second region 106 comprise a multiple gate CMOS device. FIGS. 18 and 19 show a completed device in accordance with a preferred embodiment of the present invention, for example, to be described further herein.

The fin structures 105 form the channels of the multiple gate transistors. Two gate electrodes are formed on each fin structure 105. For example, referring to FIG. 5, one gate electrode is formed on a left side of the fin structure 105 another gate electrode is formed on the right side of the fin structure 105. Thus, two gate electrodes are formed over each fin structure 105, and a gate dielectric (e.g., either first material 120 and second material 122 in region 104, or first material 120 and third material 120' in region 106) resides between the gate electrodes and the channels of the fin structure 105.

Thus, a multiple gate CMOS device is formed, wherein the PMOS transistor in the first region 104 comprises a gate dielectric 120/122 comprising a different material than the gate dielectric 120/120' of the NMOS transistor in the second region 106, in accordance with an embodiment of the present invention. Advantageously, the gate dielectric 120/122 or 120/120' materials are selected to achieve the desired work function of the PMOS or NMOS device, so that a symmetric threshold voltage $V_t$ is achieved for the multiple gate CMOS device. For example, in one embodiment, the first material 120 and the third material 120' preferably comprise a hafnium-containing material, to pin the work function of the NMOS device, and the second material 122 preferably comprises an aluminum-containing material to form a cap layer for the first material 120 of the PMOS device, pinning the work function of the PMOS device.

In one embodiment, for example, the transistor in the first region 104 comprises a PMOS transistor, and the transistor in the second region 106 comprises an NMOS transistor. The PMOS transistor preferably comprises a first work function of about 4.7 to 5.6 eV, and the NMOS transistor preferably comprises a second work function of about 3.6 to 4.5 eV. The first work function and the second work function are preferably the same predetermined amount of eV away from a mid-gap work function of about 4.6 eV, in one embodiment, for example. The gate dielectric materials 120 and 122 of the PMOS transistor in the first region 104 establish a first work function of the PMOS transistor, and the gate dielectric materials 120 and 120' establish a second work function of the NMOS transistor in the second region 106. The second work function is preferably different than the first work function, in some embodiments.

Note that in FIGS. 2 and 3, the hard mask 124 covers the PMOS device region in the first region 104 while the second material 122 is removed from over the NMOS device region in the second region 106. Alternatively, the hard mask 124 may be used as a mask in the NMOS device region (second region 106) while the second material 122 is removed from over the PMOS device region (first region 104). The third material 120' would be deposited over the first material 120 in the first region 104, in this embodiment, not shown.

In another embodiment, not shown in the figures, rather than depositing the third material 120', after removing the second material 122 from the second region 106, the gate material 126 is deposited over the second material 122 in the first region 104 and over the first material 120 in the second region 106. In this embodiment, the gate dielectric of the transistor in the first region 104 includes the first material 120 and the second material 122, and the gate dielectric of the transistor in the second region 106 includes only the first material 120, for example. Thus, the gate dielectric materials of the transistors in the first and second regions 104 and 106 are different and have different thicknesses, for example.

Figure 6:
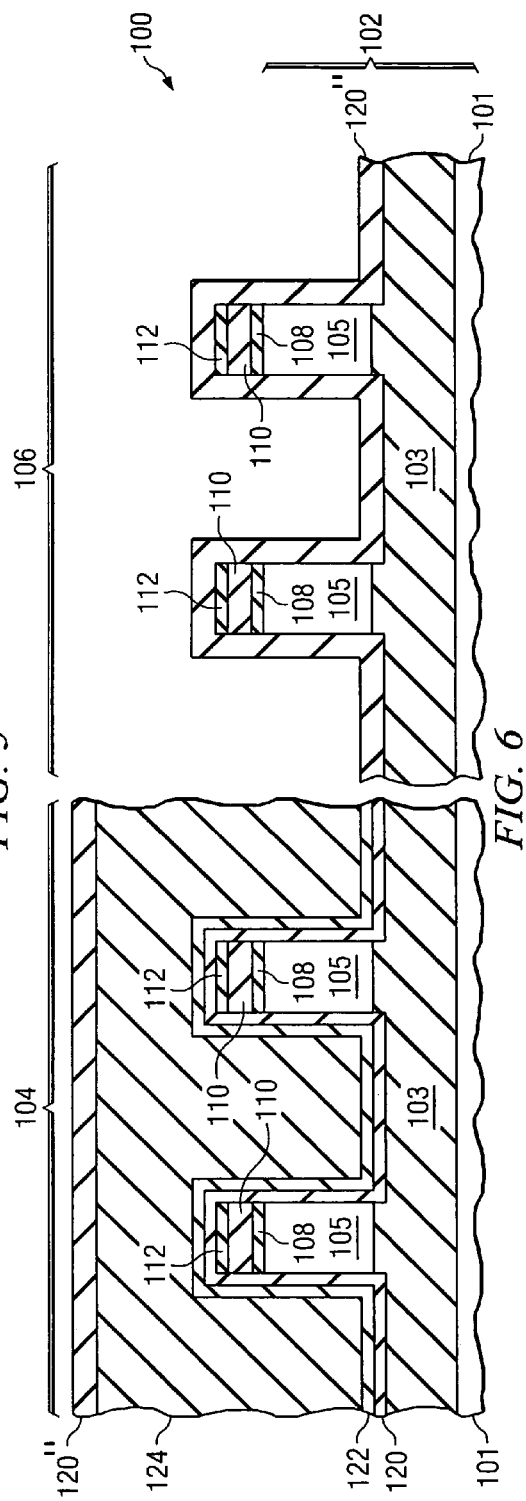

Another preferred embodiment of the present invention is shown in FIG. 6. In this embodiment, referring again to FIG.

3, with the hard mask 124 left remaining over the first region 104, the second material 122 and also the first material 120 are removed from over the workpiece 102 in the second region 106, as shown in FIG. 6. Then, a third material 120" is deposited over the workpiece 102, e.g., over the hard mask 124 in the first region 104 and over the exposed buried oxide 103 and fin structures 105 in the second region 106. The third material 120" preferably comprises a similar material as previously described for third material 120', although the thickness may be increased, as shown, for example. The hard mask and third material 120" are then removed from over the workpiece 102 in the first region 104.

In the embodiments shown in FIGS. 1 through 6, the gate dielectric 120/122 of the multiple gate PMOS transistor in the first region 104 and the gate dielectric 120/120' or 120" of the multiple gate NMOS transistor in the second region 106 are formed before the gate material is deposited over the PMOS transistor and NMOS transistor. The PMOS transistor and NMOS transistor comprise the same gate material in these embodiments, e.g., materials 126 and optional 128 comprise the material for the gate electrodes shown in FIG. 5. However, in other embodiments, shown in FIGS. 7 through 12 and FIGS. 13 through 17, the PMOS transistor and NMOS transistors may also comprise different gate electrode materials, to be described further herein.

Another preferred embodiment of the present invention is shown in FIGS. 7 through 12. Like numerals are used for the various elements that were described in FIGS. 1 through 6. To avoid repetition, each reference number shown in FIGS. 7 through 12 is not described again in detail herein. Rather, similar materials x02, x20, x22, etc., are preferably used for the various material layers shown as were described for FIGS. 1 through 6, where x=1 in FIGS. 1 through 6 and x=2 in FIGS. 7 through 12. As an example, the preferred and alternative materials and dimensions described for the first material 120, second material 122 and third materials 120' and 120" in the description for FIGS. 1 through 6 are preferably also used for the first material 220, second material 222, and third materials 220' and 220", respectively, in FIGS. 7 through 12.

Figure 9:
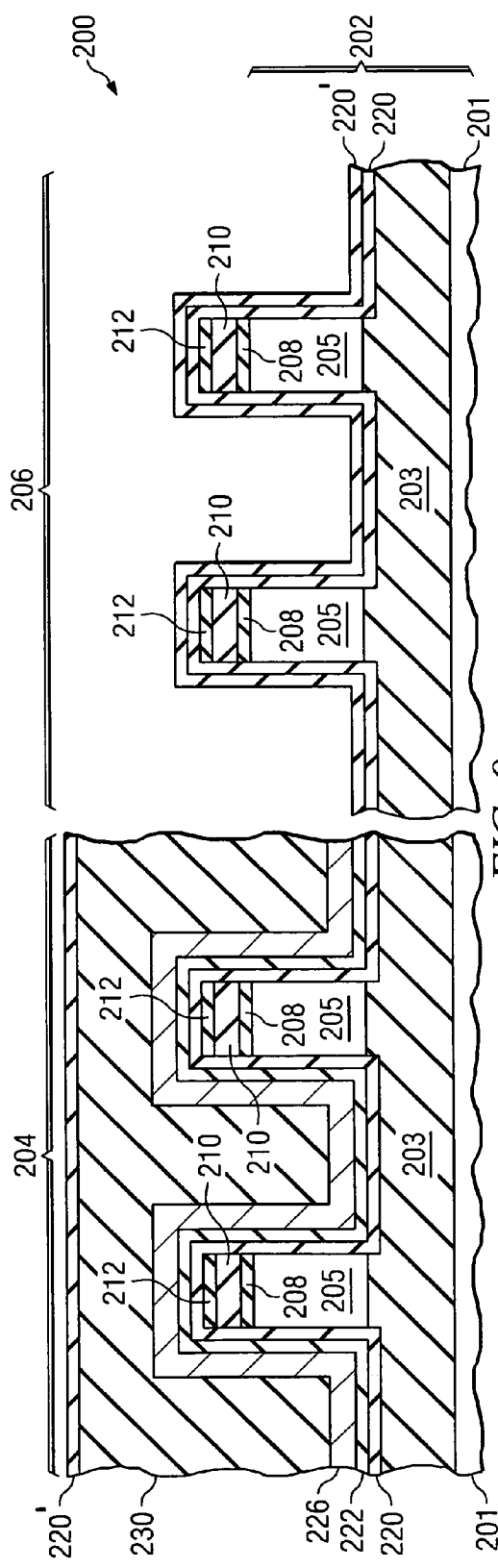
Figure 10:
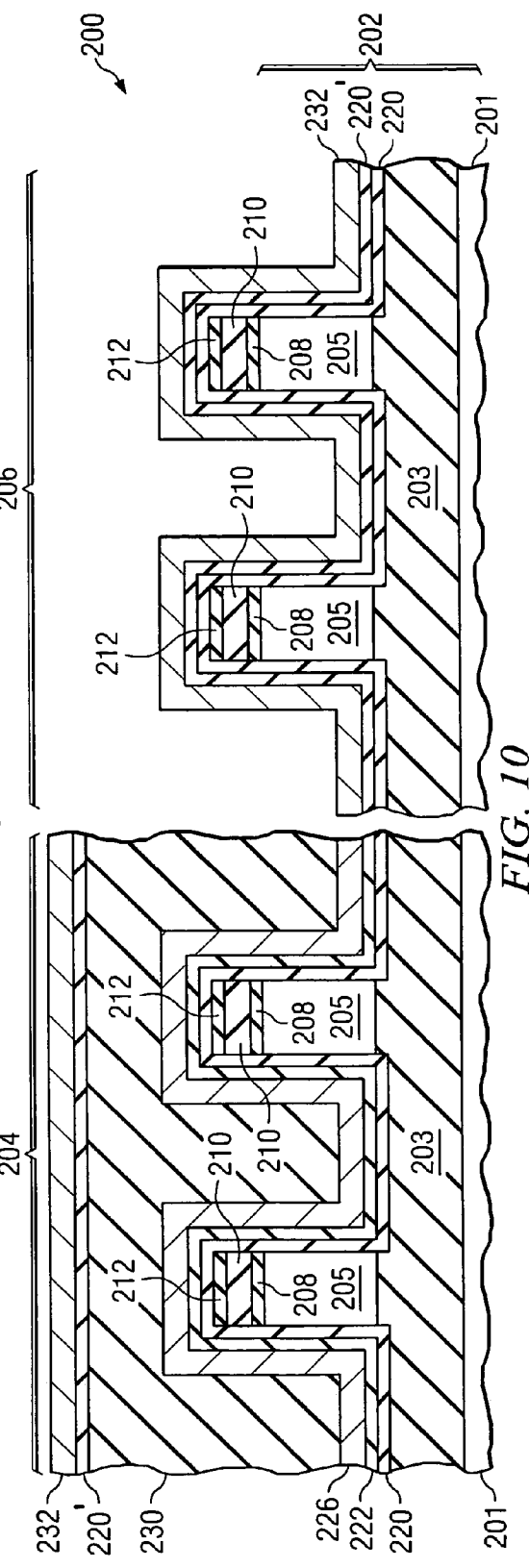

After the first material 220 and second material 222 are deposited over the buried oxide layer 203 and the fin structures 205, a first gate material 226 is deposited over the second material 222, as shown in FIG. 7. A hard mask 230 comprising similar materials and dimensions as described for hard mask 124 in FIGS. 2 through 6 is deposited over the first gate material 226, and the hard mask 230 is removed from over the second region 206 of the workpiece 202, as shown in FIG. 8. (Alternatively, the hard mask 230 may be removed from over the first region 204, not shown). The hard mask 230 is then used as a mask while the first gate material 226 and the second material 222 are removed from over the second region 206, also shown in FIG. 8. Then, the third material 220' is deposited over the hard mask 230 in the first region 204 and over the first material 220 in the second region 206, as shown in FIG. 9. A second gate material 232 is then deposited over the third material 220', as shown in FIG. 10.

Advantageously, the second gate material 232 may comprise a different material than the first gate material 226 in this embodiment, which allows the tuning of the properties of the transistors even further, to achieve the desired work function and/or threshold voltage for the multiple gate PMOS and NMOS transistors, for example. However, alternatively, the second gate material 232 may comprise the same material as the first gate material 226 in this embodiment, for example.

Next, the hard mask 230 is removed, also removing the third material 220' and the second gate material 232 in the first region 204, e.g., in a lift-off technique, as shown in FIG. 11.

An optional additional gate material 228 (e.g., a third gate material comprising polysilicon or other semiconductor material; this gate material 228 preferably comprises similar materials and dimensions as described for second gate material 128 in FIG. 5, for example) may then be deposited over the first gate material 226 and the second gate material 232, as shown in FIG. 11. The gate material layers and gate dielectric material layers are then patterned to form a multiple gate CMOS device comprising a PMOS device in the first region 204 and an NMOS device in the second region 206 of the workpiece, as previously described herein.

A multiple gate PMOS device formed in the first region 204 comprises a gate dielectric comprising the first material 220 and the second material 222, and a multiple gate NMOS device formed in the second region 206 comprises a gate dielectric comprising the first material 220 and the third material 220'. The PMOS device comprises two gate electrodes comprising the first gate material 226, and the NMOS device comprises two gate electrodes comprising the second gate material 232.

In one embodiment (not shown in the figures), after removing the first gate material 226 and the second material 222 from over the second region 206, a third material is not deposited. Rather, the second gate material 232 is deposited directly over the first material 220 in the second region 206. In this embodiment, a multiple gate PMOS device formed in the first region 204 comprises a gate dielectric comprising the first material 220 and the second material 222, and a multiple gate NMOS device formed in the second region 206 comprises a gate dielectric comprising only the first material 220, for example.

FIG. 12 shows an alternative embodiment, wherein when the mask 230 is in place over the first region 204, the first material layer 220 is also removed from over the second region 206, similar to the embodiment shown in FIG. 6. A third material layer 220" is deposited over the hard mask 230 in the first region 204 and over the exposed buried oxide 203 and fin structures 205 in the second region 206, as shown in FIG. 12. The second gate material 232 is then deposited over the third material layer 220", also shown in FIG. 12. The hard mask 230 is then removed, also removing the third material 220" and second gate material 232 from over the first region 204 of the workpiece 202. The optional additional gate material 228 (not shown in FIG. 12; see FIG. 11) may then be deposited over the structure, and the gate material layers and gate dielectric material layers are then patterned to form a multiple gate CMOS device, as previously described herein.

In this embodiment, a multiple gate PMOS device formed in the first region 204 comprises a gate dielectric comprising the first material 220 and the second material 222, and a multiple gate NMOS device formed in the second region 206 comprises a gate dielectric comprising the third material 220". The PMOS device comprises two gate electrodes comprising the first gate material 226, and the NMOS device comprises two gate electrodes comprising the second gate material 232. Advantageously, the second gate material 232 may be the same material as, or may comprise a different material than, the first gate material 226.

FIGS. 13 through 17 show cross-sectional views of a semiconductor device at various stages of manufacturing in accordance with another embodiment of the present invention. Again, like numerals are used for the various elements that were described in FIGS. 1 through 6 and FIGS. 7 through 12, and to avoid repetition, each reference number shown in FIGS. 13 through 17 is not described again in detail herein. Rather, similar materials x02, x20, x22, etc., are preferably used for the various material layers shown as were described for FIGS. 1 through 6, and 7 through 12, where x=1 in FIGS. 1 through 6, x=2 in FIGS. 7 through 12, and x=3 in FIG. 13 through 17.

First, a first material 320 is formed over exposed portions of the buried oxide layer 303 of the workpiece 302 and over the fin structures 305 formed in both the first region 304 and the second region 306 of the workpiece 302, as shown in FIG. 13. Then a first gate material 326 is formed over the first material 320, as shown in FIG. 14. A hard mask 334 is formed over the entire surface of the workpiece 302 and is removed from over the second region 306 of the workpiece 302, as shown in FIG. 14. The hard mask 334 preferably comprises similar materials and dimensions as described for hard mask 124 shown in FIGS. 2 through 6, for example.

Figure 15:
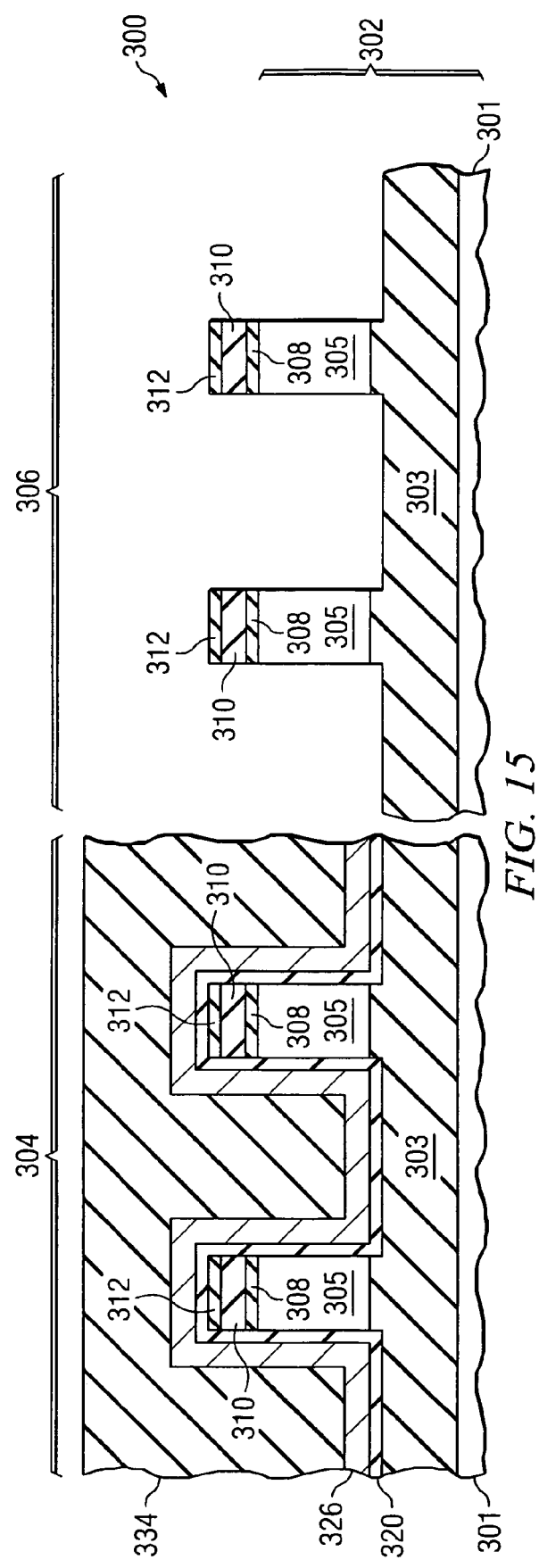

Next, the first gate material 326 and the first material 320 are removed from the second region 306 of the workpiece 302, using an etch process and using the hard mask 334 as a mask to protect the first region 304, as shown in FIG. 15. A second material 322 is then deposited over the hard mask 334 in the first region 304 and over the exposed buried oxide layer 303 and fin structures 305 in the second region 306, as shown in FIG. 16. A second gate material 332 is then deposited over the second material 322. The hard mask 334 is then removed from over the first region 304, also removing the second gate material 332 and the second material 322 from over the first region 304, leaving the structure shown in FIG. 17. The gate material layers 326 and 332 and gate dielectric material layers 320 and 322 are then patterned to form a multiple gate CMOS device, as previously described herein.

A multiple gate PMOS device formed in the first region 304 comprises a gate dielectric comprising the first material 320, and a multiple gate NMOS device formed in the second region 306 comprises a gate dielectric comprising the second material 322. The second material 322 is preferably different than the first material 320. The PMOS device comprises two gate electrodes, e.g., on the sidewalls of the fin structures 305, comprising the first gate material 326, and the NMOS device comprises two gate electrodes comprising the second gate material 332, wherein the second gate material 332 may be the same material as, or may comprise a different material than, the first gate material 326.

FIG. 18 shows a finFET device in accordance with embodiments of the present invention, after the formation of upper metallization and insulating layers over the finFET device. FIG. 19 shows a fin structure of the finFET device shown in FIG. 18 in a view perpendicular to the view shown in FIG. 18. An NMOS finFET formed in region 306, e.g., of FIG. 17 is shown in FIGS. 18 and 19, for example.

The optional gate material layer 328 comprising polysilicon is shown in FIGS. 18 and 19, and a layer of silicide 340 has been formed on top of the gate material layer or gate electrode 328. In another embodiment, the gate electrode 328 may be fully isolated, and the layer of silicide 340 may be formed only on the source 305b and drain 305c, and in the contact holes (e.g., contact 346a) that make contact with the gate electrode 328. Portions of the fin structures 305 may be implanted with dopants to form source region 305b and drain region 305c, as shown in FIG. 19. A view of the channel 305a disposed between the source region 305b and the drain region 305c can also be seen in the view shown in FIG. 19, for example. The implantation steps to form the source and drain regions 305b and 305c may alternatively take place before the manufacturing process steps described herein, in some embodiments, for example. Spacers 351 and 352 comprising an insulating material such as an oxide, nitride, or combinations thereof, may be formed over the sidewalls of the gate electrodes 332/328 and hard mask 308/310/312, also shown in FIG. 19. An isolation region 350 may be formed between adjacent devices, as shown in FIG. 19.

An insulating layer 342 is deposited over the silicide 340, and contacts 346a (FIG. 18), 346b, and 346c (FIG. 19) are formed within the insulating layer 342 to make electrical contact to regions of the finFET device. Contact 346a shown in FIG. 18 provides electrical contact to the gate of the multiple gate device, e.g., making contact with a silicide material 340 that is formed over the semiconductor material 328. Likewise, contact 346b in FIG. 19 provides electrical contact to the source 305b via silicide 340 formed over the source 305b, and contact 346c provides electrical contact to the drain 302c via silicide 340 formed over the drain 308c.

Additional metallization (e.g., 348a, 348b, and 348c) and insulating layers (e.g., 344) may be formed and patterned over the top surface of the insulating material and contacts, such as conductive lines 348a, 348b, and 348c that make electrical contact to the contacts 346a, 346b, and 346c. Bond pads (not shown) may be formed over contacts, and a plurality of the semiconductor devices 300 may then be singulated or separated into individual die. The bond pads may be connected to leads of an integrated circuit package (also not shown) or other die, for example, in order to provide electrical contact to the multiple gate transistors of the semiconductor device 300.

FIG. 20 shows a cross-sectional view of an embodiment of the present invention implemented in a tri-gate transistor device. Again, like numerals are used in FIG. 20 as were used in the previous figures, wherein x=4 in FIG. 20. In this embodiment, the insulating layers, e.g., layers 308/310/312 shown in FIG. 17, are removed before the gate dielectric material 420 and 422 are deposited, to form multiple gate devices comprising three gate electrodes: one on each of the two sidewalls of the fin structures 405, and a third gate electrode on the top of the fin. A PMOS tri-gate transistor may be formed in the first region 404, and an NMOS tri-gate transistor may be formed in the second region 406, wherein the PMOS and NMOS tri-gate transistors comprise a CMOS device, for example. One fin structure, or two or more fin structures 405 may be configured in parallel to form a single PMOS or NMOS device, for example. In FIG. 20, the embodiment from FIGS. 13 through 17 is illustrated, wherein the PMOS device in the first region 404 comprises a gate dielectric comprising the first material 420, and wherein the NMOS device in the second region 406 comprises a gate dielectric comprising the second material 422. Likewise, the other embodiments shown in FIGS. 1 through 7 and 8 through 12 may also be implemented in a tri-gate device, for example (not shown).

In one preferred embodiment, the gate dielectric of the multiple gate PMOS device preferably comprises a thin layer of a Fermi-pinning material such as $Al_2O_3$ is disposed adjacent and abutting the gate electrode, disposed over a high-k dielectric material such as $HfO_2$, and the gate dielectric of the multiple gate NMOS device comprises a single layer of high-k dielectric material. In this embodiment, for example, polysilicon or FUSI may be used as the gate electrode while still achieving a symmetric $V_{tp}$ and $V_{tn}$ for the multiple gate CMOS device. In this embodiment, for the multiple gate PMOS transistor, a polysilicon-$Al_2O_3$ interface sets the work function in the P type regime, and for the multiple gate NMOS transistor, a polysilicon-Hf interface sets the work function in the N type regime, for example.

Preferably, in accordance with another embodiment of the present invention, the gate dielectric material for a multiple gate PMOS device comprises a P type material, such as Al, Y, combinations thereof, or other materials described herein, and the gate dielectric material for a multiple gate NMOS device comprises an N type material, such as Hf, La, or combinations thereof, or other materials described herein, for example.

Another preferred embodiment, shown in FIG. 21, comprises using a thin layer of silicon 560 to pin or set the work function of the PMOS and NMOS transistors of a multiple gate CMOS device. Again, like numerals are used in FIG. 21 as were used in the previous figures, wherein x=5 in FIG. 21. A thin layer of silicon 560 is formed over the gate dielectric materials (e.g., first material 520 in region 504, and second material 522 in region 506) before forming the gate materials (e.g., 526 in region 504 and 532 in region 506). The thin layer of silicon 560 may be formed by exposing the semiconductor device 500 to a silicon-containing substance such as silane ($SiH_4$), for example, although the thin layer of silicon 560 may also be formed by exposure to other substances, for example. In other embodiments, a silicon treatment may be used to form bonds to a material in the high-k dielectric material of the gate dielectric 520 or 522, for example. If the gate dielectric material 520 or 522 comprises Hf, then the silicon treatment may result in the formation of HfSi bonds, for example. If the gate dielectric material 520 or 522 comprises Al, then the silicon treatment may result in the formation of Al—Si bonds, as another example.

The thin layer of silicon 560 may comprise a few monolayers, e.g., about 1 to 10 monolayers of silicon, in one embodiment. The silicon layer 560 may also comprise a submonolayer, e.g., the silicon layer 560 may not fully cover the top surface of the first material 520 and second material 522. The silicon layer 560 may comprise a thickness of about 30 Å or less, for example, although alternatively, the silicon layer 560 may comprise other dimensions. The silicon-containing substance used to form the thin layer of silicon 560 may comprise silane gas, e.g., $SiH_4$. In other embodiments, the silicon-containing substance may comprise $SiCl_4$ or $Si[N(CH_3)C_2H_5]_4$, as examples. Alternatively, the silicon-containing substance may comprise other materials, for example. In one embodiment, the silicon layer 560 is formed by exposing the first material 520 and second material 522 to silane gas for about 5 minutes or less at a temperature of about 300 to 500 degrees C., for example. Alternatively, the silicon layer 560 may be formed at other temperatures and lengths of time, for example.

In FIG. 21, the embodiment from FIGS. 13 through 17 is illustrated, wherein the PMOS device in the first region 504 comprises a gate dielectric comprising the first material 520, and wherein the NMOS device in the second region 506 comprises a gate dielectric comprising the second material 522. Likewise, a thin layer of silicon 560 may be formed between the gate dielectric material and the gate electrode materials in the other embodiments shown in FIGS. 1 through 7 and 8 through 12, for example (not shown). The thin layer of silicon 560 pins the work function of the transistors, for example.

Advantageously, the novel silicon layer 560 formed over the first material 520 and the second material 522 bonds to the underlying first material 520 and second material 522. When the gate material 526 and 532 is formed over the silicon layer 560, the silicon layer 560 bonded to the underlying first material 520 pins the work function of the gate material 526 in the first region 504 to a value close to or a predetermined amount away from a mid-gap work function. In one embodiment, the silicon layer 560 preferably pins the work function of the gate material 526 in the first region 504 to P type, which is desirable for a PMOS transistor. The silicon layer 560 in the first region 504 preferably sets the surface Fermi-levels of the top surface of the first material 520 to P type, for example.

The silicon layer 560 bonded to the underlying second material 522 pins the work function of the gate material 532 in the second region 506 to a value close to or a predetermined amount away from a mid-gap work function. Thus, the silicon layer 560 preferably pins the work function of the gate material 532 in the second region 506 to N type, which is desirable for an NMOS transistor. The silicon layer 560 in the second region 506 preferably sets the surface Fermi-levels of the top surface of the second material 522 to N type, for example.

The silicon layer 560 chemically treats the surface of the underlying first material 520 and second material 522 to create bonds that will set the surface work function. The Fermi-level state after the silicon treatment is a function of the parameters of the silicon-containing substance treatment, e.g., exposure time, pressures, and flow rate. These and other parameters of the silicon-containing substance exposure may be varied to tune the work function and achieve the desired $V_t$ levels, for example. After the Fermi-levels of the top surface of the first material 520 and second material 522, e.g., the gate dielectric materials, are set, the $V_{fb}$, and hence, the $V_{tn}/V_{tp}$ of the device 500 is determined. Advantageously, because the silicon layer 560 is thin, e.g., a few monolayers or a sub-monolayer thick, the effective oxide thickness (EOT) of transistors formed in the first region 504 and the second region 506 is not substantially increased.

Referring again to FIG. 17, in some embodiments, the first material 320 comprising the first gate dielectric material of a PMOS device in the first region 304 preferably comprises a first element, and the second material 322 comprising the second gate dielectric material of an NMOS device in the second region 306 preferably comprises a second element, wherein the second element is different from the first element. The first material 320 is preferably a P type material, and the second material 320 is preferably an N type material, for example.

In this embodiment, the first gate dielectric material 320 preferably comprises a first element comprising Al, Y, Sc, Lu, Lr, La, Ce, Pr, Nd, Pm, Sm, Eu, Gd, Tb, Dy, Ho, Er, Tm, Zr, or Yb, as examples, although alternatively, the first element may comprise other elements. The first element may comprise an element from Column IIIb of the Periodic Table, a Lanthanoid from the Periodic table, Al or an Al-containing material, as examples. In one embodiment, e.g., when the first transistor in the first region 304 comprises a multiple gate PMOS transistor, the first gate dielectric material 320 preferably comprises a Y-containing insulating material or an Al-containing insulating material, for example. These materials are particularly beneficial for tuning or shifting the flatband voltage $V_{FB}$ of the multiple gate PMOS transistor, and thus provide tunability of the $V_t$ of the multiple gate PMOS transistor in the first region 304, for example. The other types of first elements described herein are also preferably adapted to provide the ability to tune the $V_t$ of the multiple gate PMOS transistor in the first region 304 by varying the amount of the first element in the first gate dielectric material 320, for example. In one embodiment, the first gate dielectric material 320 preferably comprises an Al-containing insulating material, a Y-containing insulating material, or a combination thereof, for example.

In one embodiment, the first gate dielectric material 320 preferably comprises a fourth material comprising a first element (e.g., such as Y, Al, or the other elements previously described herein) combined with a fifth material, such as Hf, Zr, Ta, Ti, Al, or Si, and also combined with either O, N, or both O and N. In another embodiment, the first gate dielectric material 320 preferably comprises a fourth material comprising the first element, a fifth material comprising Hf, Zr, Ta, Ti, Al, or Si, and also either O, N, or both O and N, and further comprising a sixth material, such as Ti, Sr, or Sc. As examples, the first gate dielectric material 320 may comprise YHfO, YHfTiO, or AlO, although alternatively, the first gate dielectric material 320 may comprise other materials. The first gate dielectric material 320 may comprise about 5 to 95% of the fifth material and about 95 to 5% of the fourth material. Note that the fourth material is also referred to herein as a first material, the fifth material is also referred to herein as a second material, and the sixth material is also referred to herein as a third material, (e.g., in the claims).

Also, in this embodiment, the second gate dielectric material 322 of the multiple gate NMOS device preferably comprises a second element comprising Hf, La, Sc, Y, Lu, Lr, Ce, Pr, Nd, Pm, Sm, Eu, Gd, Tb, Dy, Ho, Er, Tm, Zr, or Yb, as examples, although alternatively, the second element may comprise other elements. The second element may comprise an element from Column IIIb of the Periodic Table, or a Lanthanoid from the Periodic Table, as examples. In one embodiment, the second gate dielectric material 322 preferably comprises an La-containing insulating material, an Hf-containing insulating material, or a combination thereof, for example.

Advantageously, for the multiple gate NMOS transistor in region 306, if the second gate dielectric material 322 comprises La, then the La shifts the flatband voltage $V_{FB}$ of the multiple gate NMOS transistor, allowing tunability of the threshold voltage $V_t$. The other types of second elements of the second gate dielectric material 322 described herein also are preferably adapted to tune the $V_t$ of the multiple gate NMOS transistor in the second region 306, for example.

In one embodiment, the second gate dielectric material 322 preferably comprises a fourth material such as the second element combined with a fifth material, such as Hf, Zr, Ta, Ti, Al, or Si, and also combined with either O, N, or both O and N. In another embodiment, the second gate dielectric material 322 preferably comprises a fourth material comprising the second element, a fifth material comprising Hf, Zr, Ta, Ti, Al, or Si, and also either O, N, or both O and N, and further comprising a sixth material, such as Ti, Sr, or Sc. As examples, the second gate dielectric material 322 may comprise LaHfO or LaHfTiO, although alternatively, the second gate dielectric material 322 may comprise other La-containing insulating materials or second element-containing materials. The second gate dielectric material 322 may comprises about 5 to 95% of the fifth material and about 95 to 5% of the fourth material. Note that the fourth material is also referred to herein as a first material, the fifth material is also referred to herein as a second material, and the sixth material is also referred to herein as a third material, (e.g., in the claims).

In another embodiment, the concentration of the first element, such as Al or Y, in the multiple gate PMOS transistor gate dielectric material 320, and the concentration of the second element, such as La or Hf, in the multiple gate NMOS transistor gate dielectric material 322, may be varied to tune the CMOS transistors so that the threshold voltages $V_t$ are symmetric.

In another embodiment, preferably, the first element of the first dielectric material 320 of the multiple gate PMOS transistor in the first region 304 does not comprise an N type material such as La or Hf, and the second element of the second dielectric material 322 of the multiple gate NMOS transistor in the second region 306 does not comprise a P type material such as Al or Y, for example.

In some embodiments, if the first gate material 326 comprises a semiconductor material and the second gate material 332 comprises a semiconductive material (see FIG. 17), then the first gate material 326 (e.g., for the PMOS device) may be doped with an n type dopant such as As, P, Sb, or Bi, as examples. The second gate material 332, e.g., for the multiple gate NMOS device, may be doped with a p type dopant, such as B, Al, Ga, In, or Tl, or an n type dopant, for example. Doping the gate materials makes the gate material more conductive, for example, and also reduces or avoids a polysilicon depletion effect in the multiple gate transistors, advantageously.

In other embodiments, if the first gate material 322 and the second gate material 326 comprise a conductor or a metal, materials may also be implanted into the gate materials 322 and 326. For example, the first gate material 322 and/or the second gate material 326 may comprise Mo, and N may be implanted into the Mo. Alternatively, the first gate material 322 and/or the second gate material 326 may comprise TiN, and Si may be implanted into the TiN. The first gate material 322 and/or the second gate material 326 may alternatively comprise other metals implanted with other materials, for example. The implantation steps into the gate materials in these embodiments may decrease the resistance of the gate materials 322 and 326, for example.

Preferably, in some embodiments, the gate dielectrode materials and other parameters are selected so that a work function shift of at least 200 mV is achieved, in some embodiments, for example, although alternatively, other work function shifts may be achieved. In other embodiments, for example, a mid-gap band of about 4.6 eV +/– about 0.1 to 1 V may be achieved, for example. Advantageously, the materials of the gate dielectrics of the transistors, and/or the use of the thin layer of silicon, are varied and tuned to adjust the work function to the desired value, so that a symmetric threshold voltage is achieved for the PMOS and NMOS transistors of a CMOS device, in accordance with embodiments of the present invention.

In yet another embodiment, only one type of gate dielectric material may be deposited over the fin structures 305, and one region, e.g., either the first region 304 or the second region 306, are implanted with a dopant to alter the gate dielectric material in that region 304 or 306. For example, in FIG. 13, rather than depositing a gate material 326 as shown in FIG. 14, a hard mask such as 334 shown in FIG. 14 may be deposited directly over the gate dielectric material 320 (also referred to herein as a first material 320) in the second region 306. The first material in the first region 304 that is unmasked is then implanted with a dopant, to form a second material in the first region 304 (e.g., such as material 322 shown in FIG. 16 in the second region 306—the second gate material would not be present in this embodiment), leaving the first material 320 in the second region 306 unchanged (not shown in the drawings).

In this embodiment, advantageously, a single layer of gate dielectric material 320 and a single layer of gate material, e.g., such as gate material 126 in FIG. 5, are required to be deposited over the fin structures 105/305 of the workpiece, reducing the number of manufacturing process steps, for example. The gate dielectric material is altered in one region by implanting the dopant so that the gate dielectrics of the transistors are different.

In this embodiment, the gate dielectric material (e.g., 320 in FIG. 14) preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $SiO_2$, or combinations thereof, for example, although alternatively, the gate dielectric material 320 may comprise other materials, such as the materials previously described herein. The gate dielectric material 320 may comprise a thickness of a few hundred Angstroms or less, for example. The gate material 320 may comprise a semiconductor material or a metal, for example. For example, the gate material (e.g., 126 in FIG. 5) may comprise polysilicon, other semiconductor materials, TiN, TiCN, TiSiN, HfN, TaN, TaCN, W, Al, Ru, RuTa, TaSiN, NiSi$_x$, CoSi$_x$, TiSi$_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, a fully silicided gate material (FUSI), other metals, and/or combinations thereof, or other materials, such as the materials previously described herein, as examples.

In this embodiment, a Fermi-pinning material is preferably implanted in the first region 304 where a multiple gate PMOS transistor will be formed. Preferably, the Fermi-pinning material is implanted in the first region 304 but not in the second region 306, as shown. For example, the gate dielectric material and/or gate material may be covered with photoresist or an insulating material during the implantation process. Implanting the Fermi-pinning material may comprise implanting aluminum, for example, although alternatively, the implanted Fermi-pinning may comprise other Fermi-pinning materials.

The Fermi-pinning material may be implanted after the gate material is deposited, for example, or before the gate material is deposited. If the gate material is deposited first, then preferably, the Fermi-pinning material is implanted into at least the gate material over the first region 304 of the workpiece 302. For example, in another embodiment, the Fermi-pinning material is preferably also implanted into a top surface of the gate dielectric material in the first region 304.

Because the Fermi-pinning material is implanted into the first region 304 and not the second region 306 of the workpiece 402, the gate material and/or gate dielectric material for the first region 304 and second region 306 are now advantageously different, producing a novel multiple gate CMOS device having different gate dielectric materials and a symmetric $V_t$ for a multiple gate PMOS transistor and multiple gate NMOS transistor, as shown in FIGS. 9 and 10. This embodiment is advantageous in that the number of lithography masks required to manufacture the semiconductor device 300 is further reduced.

Another embodiment of the present invention includes a semiconductor device and a method of manufacturing the same, wherein a first multiple gate transistor comprises a first gate dielectric material, and a second multiple gate transistor proximate the first transistor comprises a second gate dielectric material, wherein the second gate dielectric material is different than the first gate dielectric material. Either the first gate dielectric material, the second gate dielectric material, or both the first gate dielectric material and the second gate dielectric material have a dielectric constant of about 4.0 or greater. Either the first gate dielectric material, the second gate dielectric material, or both the first gate dielectric material and the second gate dielectric material preferably comprise a Fermi-pinning material. The Fermi-pinning material preferably comprises Hf, La, Al, Y, Sc, Lu, Lr, Ce, Pr, Nd, Pm, Sm, Eu, Gd, Tb, Dy, Ho, Er, Tm, Zr, Yb, or combinations thereof, as examples, although the first gate dielectric material and/or second gate dielectric material may also include other materials.

The Fermi-pinning material of the first gate dielectric material and/or second gate dielectric material may be implanted or deposited, for example. In some embodiments, the first multiple gate transistor comprises a plurality of gate electrodes proximate the first gate dielectric material, and the Fermi-pinning material is implanted into at least the plurality of gate electrodes, e.g., the Fermi-pinning material may also be implanted into the first gate dielectric material. In some embodiments, the Fermi-pinning material may be implanted into the second gate dielectric material, but not the first gate dielectric material. For example, a single type of dielectric material may be deposited over both the first multiple gate transistor and the second multiple gate transistor, and the single type of dielectric material is altered over the second multiple gate transistor by implanting the Fermi-pinning material into the single type of dielectric material over the second multiple gate transistor, but not the first multiple gate transistor. In yet another embodiment, one type of Fermi-pinning material may be implanted into the dielectric material in one region, and different type of Fermi-pinning material may be implanted into another region, for example.

Experimental results have shown that a multiple gate transistor having a gate dielectric comprising $HfO_2$ and a gate electrode comprising polysilicon have an effective work function of 4.2 eV, and thus, this material combination is a preferred embodiment for a multiple gate PMOS device. Experimental results have also shown that a multiple gate transistor having a gate dielectric comprising $Al_2O_3$ and a gate electrode comprising polysilicon have an effective work function of 4.8 eV, and thus, this material combination is a preferred embodiment for a multiple gate NMOS device. The same gate dielectric materials used with a gate electrode comprising TiN were found to have an effective work function of about 4.4 eV and 4.7 eV, respectively, for $HfO_2$ and $Al_2O_3$ gate dielectric materials, and thus, these material combinations are also preferred embodiments for a PMOS and NMOS device, respectively, as another example. $LaO_x$ and $YO_x$ are also preferred gate dielectric materials for a multiple gate PMOS and NMOS device, respectively, as another example. Other material combinations may also be used, as described previously herein.

Novel multiple gate CMOS devices are formed using the novel manufacturing methods described herein. The multiple gate CMOS device have a symmetric threshold voltage, e.g., for the PMOS and NMOS transistors. For example, $V_{tp}$ may be about −0.2 to −5 V, and $V_{tn}$ may be the substantially the same positive value, e.g., about +0.2 to +5 V). Several methods of manufacturing multiple gate CMOS devices are disclosed, wherein the gate dielectric material of the multiple gate PMOS device is different than the gate dielectric material for the multiple gate NMOS device. Another advantage of having different gate dielectric materials for the multiple gate NMOS and PMOS transistors described herein is providing the ability to optimize electron and hole mobility more easily, using two different gate dielectric materials.

Embodiments of the present invention utilize an understanding of materials, e.g., such as that Si—Al pins to p-type and Si—Hf pins to n-type, to take advantage of the Fermi-pinning effect, rather than trying to solve the effect or work around it. The threshold voltage $V_t$ is decreased and the flat band voltage is easy to tune. Embodiments of the invention may utilize high-k dielectric materials as the gate dielectric for multiple gate transistors, using polysilicon, metal, or FUSI gate electrodes. The metal gate electrodes of the multiple gate transistors may comprise either single metal or dual-work function metals, e.g., the gate electrode for the multiple gate PMOS and NMOS transistors may be the same material or different materials.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming a first transistor, the first transistor including at least two first gate electrodes, a first gate dielectric being disposed proximate each of the at least two first gate electrodes, the first gate dielectric comprising a first gate dielectric material; and
    forming a second transistor proximate the first transistor, the second transistor including at least two second gate electrodes, a second gate dielectric being disposed proximate each of the at least two second gate electrodes, the second gate dielectric comprising a second gate dielectric material, wherein the second gate dielectric material is different than the first gate dielectric material, wherein forming the first transistor and forming the second transistor comprises forming at least one fin structure, the at least one fin structure comprising channels of the first transistor and the second transistor, further comprising forming a first material over the at least one fin structure, forming a second material over the first material, removing the second material and the first material from over the at least one fin structure of the second transistor, and forming a third material over the at least one fin structure of the second transistor, wherein the first material and the second material comprise the first gate dielectric material of the first transistor, and wherein the third material comprises the second gate dielectric material of the second transistor.

2. The method according to claim 1, wherein the at least two first gate electrodes and the at least two second gate electrodes comprise TiN, TiCN, HfN, TaN, W, Al, Ru, RuN, RuSiN, RuTa, TaSiN, TiSiN, TaCN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, LaN, LaSiN, WSiN, WSi, polysilicon, a partially silicided material, a fully silicided material (FUSI), other metals, and/or combinations and multiple layers thereof.

3. The method according to claim 1, wherein the first transistor comprises a PMOS transistor, wherein the second transistor comprises an NMOS transistor, wherein a first work function of the first gate electrodes comprises about 4.7 to 5.6 eV, and wherein a second work function of the second gate electrodes comprises about 3.6 to 4.5 eV.

4. The method according to claim 3, wherein the PMOS transistor and the NMOS transistor comprise symmetric threshold voltages.

5. The method according to claim 1, wherein the first material comprises a first element, wherein the second material comprises a second element, wherein the first gate dielectric comprises about 5% to about 95% of the second element and about 95% to about 5% of the first element.

6. The method according to claim 5, wherein the first element comprises Hf, Zr, Ta, Ti, Al, or S, wherein the second element comprises O, N, or both O and N, and wherein the first material further comprises a third element, the third element comprising Ti, Sr, or Sc.

7. The method according to claim 1, wherein the at least two first gate electrodes of the first transistor comprise the first gate material, and wherein the at least two second gate electrodes of the second transistor comprise the second gate material.

8. The method according to claim 1, further comprising, before forming the first transistor and forming the second transistor:
    providing a workpiece, the workpiece comprising a silicon-on-insulator (SOI) substrate having a substrate, a buried insulating layer disposed over the substrate, and a layer of semiconductor material disposed over the buried insulating layer.

9. The method according to claim 8, further comprising:
    treating the first gate dielectric material and the second gate dielectric material with a silicon-containing substance before forming the at least two first gate electrodes over the first gate dielectric material and before forming the at least two second gate electrodes over the second gate dielectric material.

10. The method according to claim 1, wherein the first material comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof.

11. The method according to claim 1, wherein the second material comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $O_x$,$ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof.

12. The method according to claim 1, wherein the third material comprises $HfO_2$, $HfSiO_x$, $Al_2O_3$, $ZrO_2$, $ZrSiO_x$, $Ta_2O_5$, $La_2O_3$, $SiO_2$, $TiO_2CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$) nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof.

13. A method of manufacturing a semiconductor device, the method comprising:
    forming a first transistor, the first transistor including at least two first gate electrodes, a first gate dielectric being disposed proximate each of the at least two first gate electrodes, the first gate dielectric comprising a first gate dielectric material; and
    forming a second transistor proximate the first transistor, the second transistor including at least two second gate electrodes, a second gate dielectric being disposed proximate each of the at least two second gate electrodes, the second gate dielectric comprising a second gate dielectric material, wherein the second gate dielectric material is different than the first gate dielectric material, wherein forming the first transistor and forming the second transistor comprises forming at least one fin structure, the at least one fin structure comprising channels of the first transistor and the second transistor, further comprising forming a first material over the at least one fin structure, forming a second material over the first material, forming a first gate material over the second material, removing the first gate material, the second material, and the first material from over the at least one fin structure of the second transistor, forming a third material over the at least one fin structure of the second transistor, and forming a second gate material over the third material of the second transistor, wherein the first material and the second material comprise the first gate dielectric material of the first transistor, wherein the third material comprises the second gate dielectric material of the second transistor, wherein the at least two first gate electrodes of the first transistor comprise the first gate material, and wherein the at least two second gate electrodes of the second transistor comprise the second gate material.

14. The method of claim 13, wherein the first gate dielectric material, the second gate dielectric or both the first and second gate dielectric materials comprise an element from column IIIb or Lanthanoid series of the periodic table.

15. The method of claim 14, wherein the first multiple gate transistor is a PMOS and the second multiple gate transistor is an NMOS.

16. The method of claim 15, wherein the first gate dielectric material comprises Y and the second gate dielectric material comprises La.

17. The method of claim 16, wherein the first gate dielectric material does not comprise La or Hf, and wherein the second gate dielectric material does not comprise Y or Al.

18. The method according to claim 13, wherein the first gate dielectric and the second gate dielectric comprise $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_x TiO_3$), PST ($PbSc_xTa_{(1-a)}O_3$) nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN (Pb-$Mg_xNb_{(1-x)}O_3$), combinations thereof, or multiple layers thereof.

19. A method of manufacturing a semiconductor device, the method comprising:
forming a first multiple gate transistor comprising a first gate dielectric material; and
forming a second multiple gate transistor proximate the first transistor, the second transistor comprising a second gate dielectric material, wherein the second gate dielectric material is different than the first gate dielectric material, and wherein either the first gate dielectric material, the second gate dielectric material, or both the first gate dielectric material and the second gate dielectric material have a dielectric constant of about 4.0 or greater, and wherein forming the first multiple gate transistor and forming the second multiple gate transistor comprises forming a plurality of fin structures, depositing a single layer of gate dielectric material over the plurality of fin structures, and implanting a first Fermi-pinning material into the single layer of gate dielectric material of the first multiple gate transistor, but not into the single layer of gate dielectric material of the second multiple gate transistor.

20. The method according to claim 19, wherein the first gate dielectric and the second gate dielectric comprise $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_x TiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN (Pb-$Mg_xNb_{(1-x)}O_3$), combinations thereof, or multiple layers thereof.

21. The method according to claim 19, wherein the first gate dielectric includes a first element comprising Al, Y, Sc, Lu, Lr, La, Ce, Pr, Nd, Pm, Sm, Eu, Gd, Tb, Dy, Ho, Er, Tm, Zr, or Yb, wherein the second gate dielectric includes a second element comprising Hf, La, Sc, Y, Lu, Lr, Ce, Pr, Nd, Pm, Sm, Eu, Gd, Tb, Dy, Ho, Er, Tm, Zr, or Yb, the second element being different than the first element.

22. The method according to claim 19, wherein either the first gate dielectric material, the second gate dielectric material, or both the first gate dielectric material and the second gate dielectric material comprise a second Fermi-pinning material.

23. The method according to claim 22, wherein the first Fermi-pinning material and the second Fermi-pinning material comprises elements selected from the group consisting of Hf, La, Al, Y, Sc, Lu, Lr, Ce, Pr, Nd, Pm, Sm, Eu, Gd, Tb, Dy, Ho, Er, Tm, Zr, Yb, or combinations thereof, and wherein the elements selected for the first and second Fermi-pinning materials are different.

24. The method according to claim 19, implanting a first Fermi-pinning material into the single layer of gate dielectric material, implanting the first Fermi-pinning material into at least the plurality of gate electrodes, the plurality of gate electrodes proximate the single layer of gate dielectric material.

25. The method according to claim 19, wherein the first multiple gate transistor comprises a PMOS transistor comprising a plurality of first gate electrodes proximate the first gate dielectric material, wherein the second multiple gate transistor comprises an NMOS transistor comprising a plurality of second gate electrodes proximate the second gate dielectric material, further comprising implanting a material into the plurality of first gate electrodes, the plurality of second gate electrodes, or both the plurality of first gate electrodes and the plurality of second gate electrodes.

26. The method according to claim 25, wherein implanting the material into the plurality of first gate electrodes comprises implanting a P type dopant into the plurality of first gate electrodes, and wherein implanting the material into the plurality of second gate electrodes comprises implanting an N or P type dopant into the plurality of second gate electrodes.

* * * * *

UNITED STATES PATENT AND TRADEMARK OFFICE
CERTIFICATE OF CORRECTION

PATENT NO. : 7,462,538 B2 Page 1 of 1
APPLICATION NO. : 11/273747
DATED : December 9, 2008
INVENTOR(S) : Li et al.

It is certified that error appears in the above-identified patent and that said Letters Patent is hereby corrected as shown below:

In Col. 22, line 36, delete "$SiAlO_xN_{l-x-y}$" and insert --$SiAlO_xN_{1-x-y}$,--.
In Col. 22, line 45, delete "$SiALO_x$" and insert --$SiAlO_x$--.
In Col. 22, line 51, delete "$TiO_2CeO_2$" and insert --$TiO_2, CeO_2$--.
In Col. 22, line 55, delete "$(PbZn_xNb_{(1-X)}$" and insert --"$(PbZn_xNb_{(1-x)}$--.

Signed and Sealed this

Thirty-first Day of March, 2009

JOHN DOLL
*Acting Director of the United States Patent and Trademark Office*